(12) United States Patent
Chen et al.

(10) Patent No.: US 11,715,733 B2
(45) Date of Patent: Aug. 1, 2023

(54) INTEGRATED CIRCUIT DEVICE AND METHOD

(71) Applicant: TAIWAN SEMICONDUCTOR MANUFACTURING COMPANY, LTD., Hsinchu (TW)

(72) Inventors: Wei-Ren Chen, Hsinchu (TW); Cheng-Yu Lin, Hsinchu (TW); Hui-Zhong Zhuang, Hsinchu (TW); Yung-Chen Chien, Hsinchu (TW); Jerry Chang Jui Kao, Hsinchu (TW); Huang-Yu Chen, Hsinchu (TW); Chung-Hsing Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 97 days.

(21) Appl. No.: 17/313,474

(22) Filed: May 6, 2021

(65) Prior Publication Data

US 2022/0359491 A1 Nov. 10, 2022

(51) Int. Cl.
| | |
|---|---|
| *H01L 27/02* | (2006.01) |
| *H01L 27/092* | (2006.01) |
| *G06F 30/394* | (2020.01) |
| *H01L 21/8238* | (2006.01) |
| *G06F 30/392* | (2020.01) |
| *H01L 23/522* | (2006.01) |

(52) U.S. Cl.
CPC ........ *H01L 27/0207* (2013.01); *G06F 30/392* (2020.01); *G06F 30/394* (2020.01); *H01L 21/823871* (2013.01); *H01L 23/5226* (2013.01); *H01L 27/092* (2013.01)

(58) Field of Classification Search
CPC .............. H01L 27/0207; H01L 27/092; H01L 21/823871; H01L 23/5226; G06F 30/392; G06F 30/394
USPC ........................................................ 257/369
See application file for complete search history.

(56) References Cited

U.S. PATENT DOCUMENTS

| | | | |
|---|---|---|---|
| 6,407,434 B1* | 6/2002 | Rostoker | H01L 23/5222 |
| | | | 257/E29.022 |
| 7,260,442 B2 | 8/2007 | Hwang et al. | |
| 9,256,709 B2 | 2/2016 | Yu et al. | |
| 2014/0040838 A1 | 2/2014 | Liu et al. | |
| 2015/0278429 A1 | 10/2015 | Chang | |
| 2022/0216270 A1* | 7/2022 | Hsu | H01L 27/281 |

* cited by examiner

*Primary Examiner* — Tu-Tu V Ho
(74) *Attorney, Agent, or Firm* — Hauptman Ham, LLP

(57) ABSTRACT

An integrated circuit (IC) device includes a substrate, and a cell over the substrate. The cell includes at least one active region and at least one gate region extending across the at least one active region. The cell further includes at least one input/output (IO) pattern configured to electrically couple one or more of the at least one active region and the at least one gate region to external circuitry outside the cell. The at least one IO pattern extends obliquely to both the at least one active region and the at least one gate region.

20 Claims, 29 Drawing Sheets

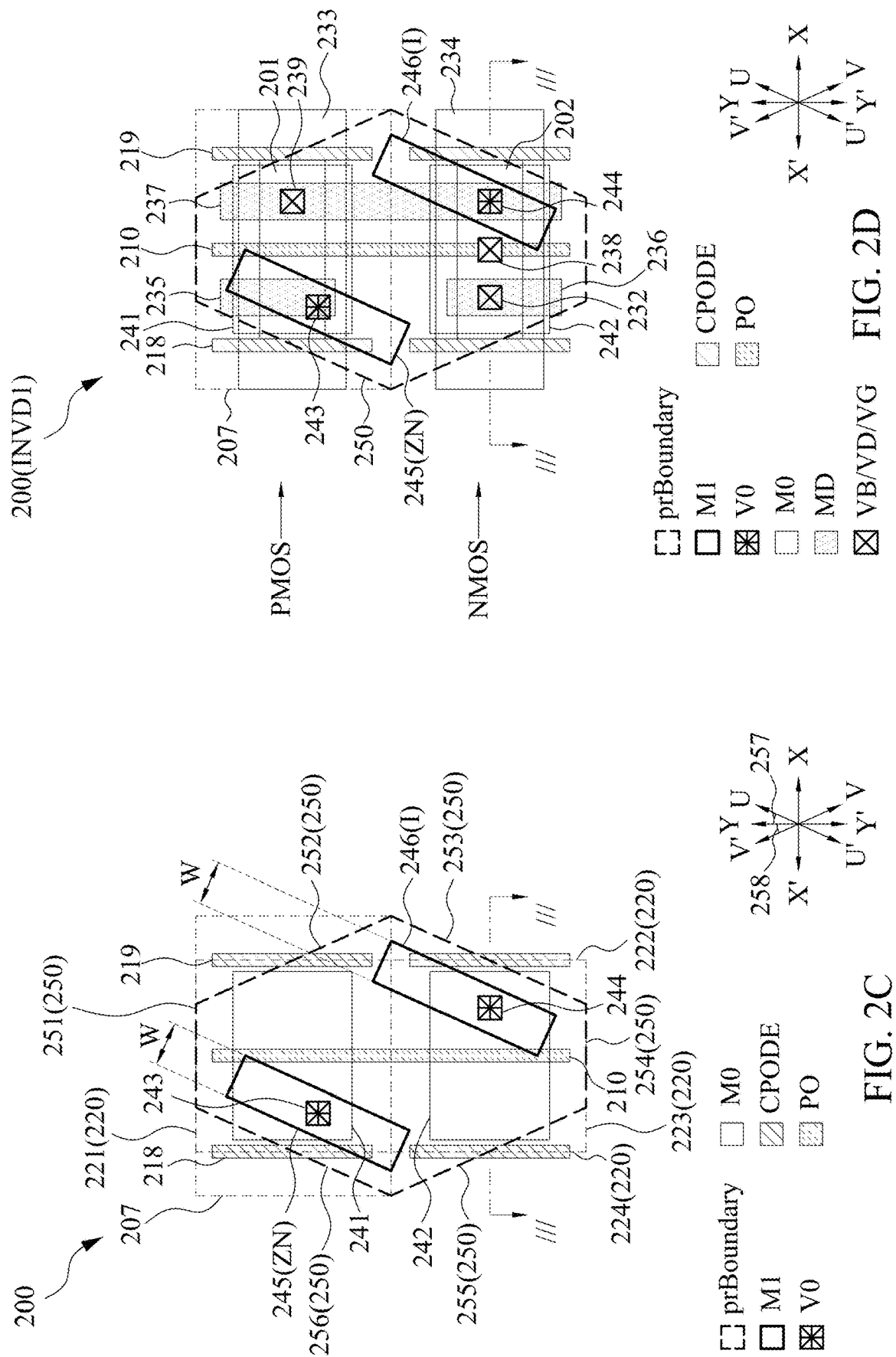

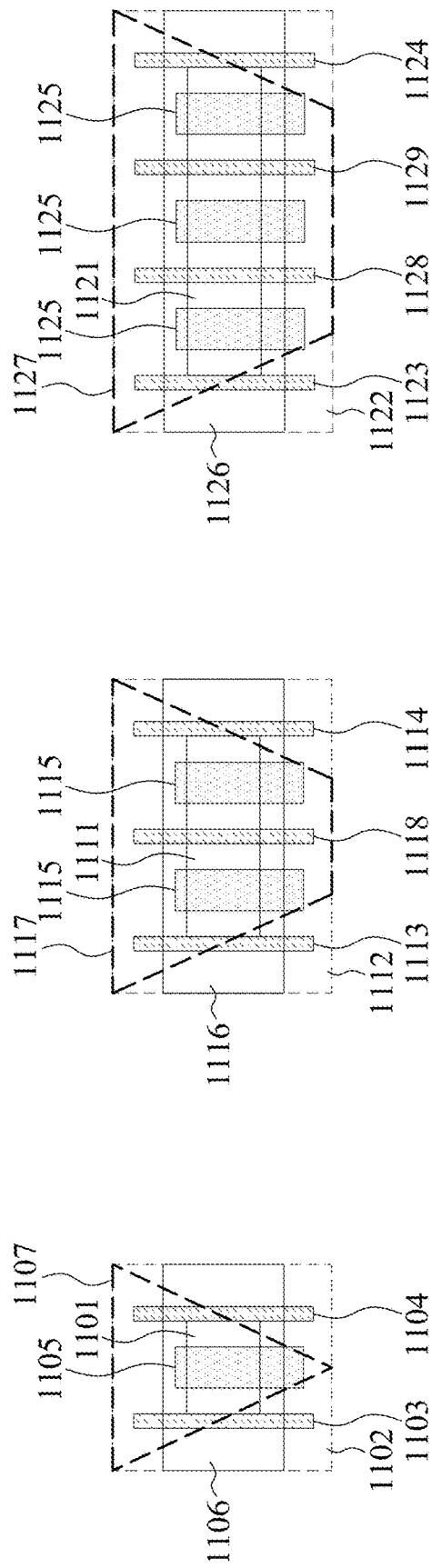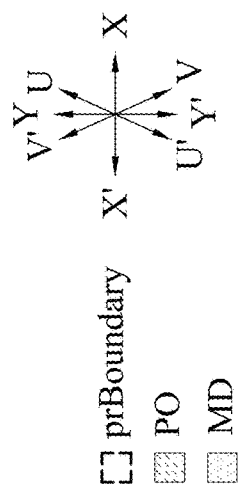
FIG. 11C
FIG. 11B
FIG. 11A

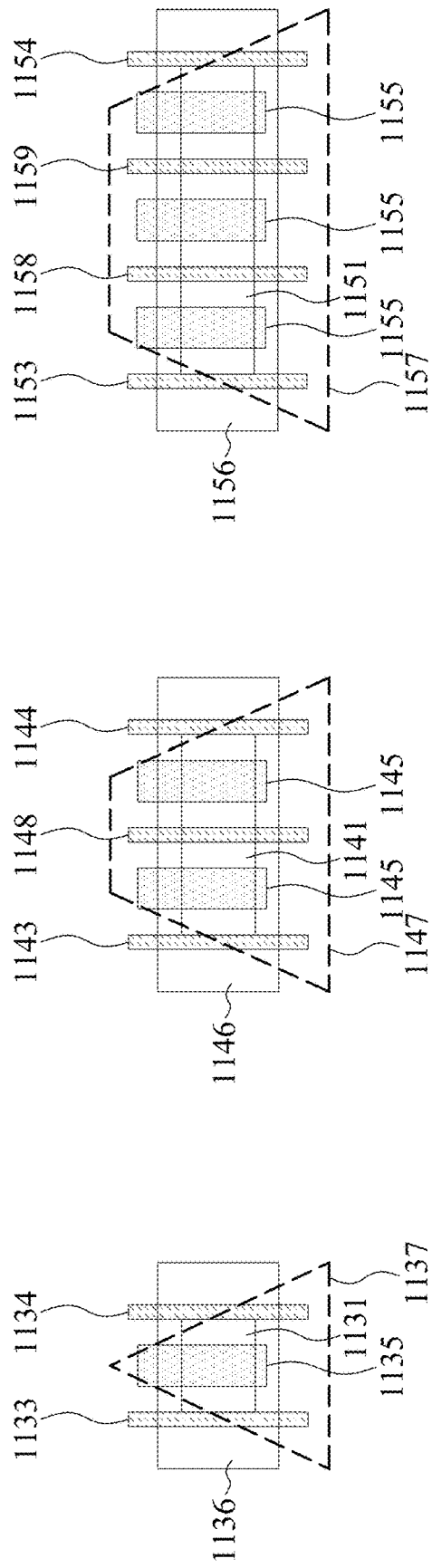
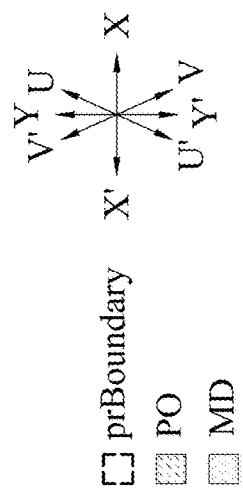
FIG. 11D FILL 4
FIG. 11E FILL 5
FIG. 11F FILL 6

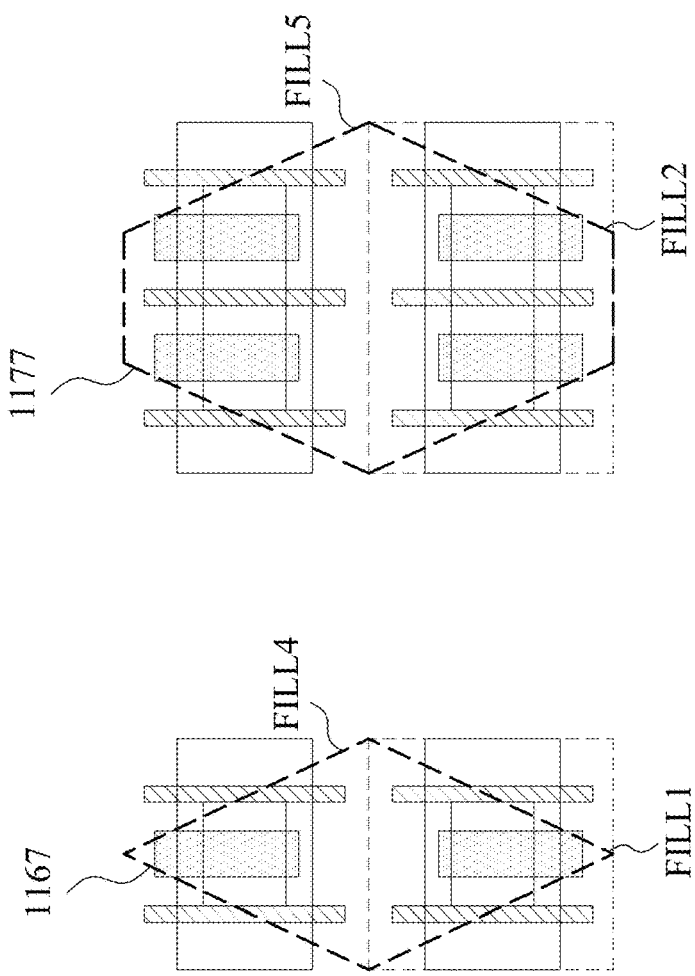
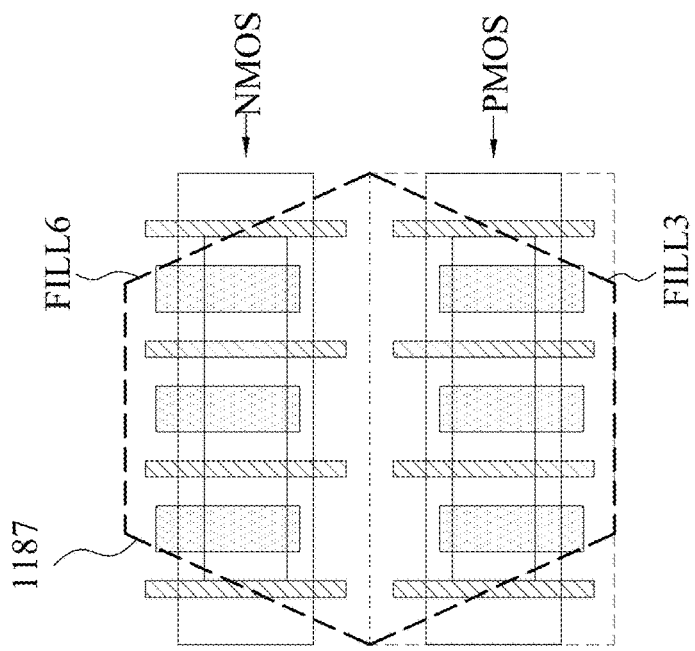
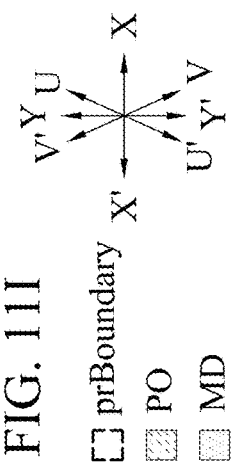
FILL 7
FIG. 11G
FILL 8
FIG. 11H
FILL 9
FIG. 11I

1300C

1315
based on the layout diagram, fabricating one or more components of an IC device

1345 — forming at least one gate region across at least one active region over a substrate

1355 — depositing and patterning, in a metal layer over the at least one gate region, a conductive pattern overlapping and electrically coupled to the at least one active region or the at least one gate region

1365 — depositing and patterning, in a pin access layer over the metal layer, an input/output (IO) pattern overlapping and electrically coupled to the conductive pattern, wherein the IO pattern and the at least one gate region form an acute angle therebetween

FIG. 13C

INTEGRATED CIRCUIT DEVICE AND METHOD

BACKGROUND

An integrated circuit ("IC") device includes one or more semiconductor devices represented in an IC layout diagram (also referred to as "layout diagram"). A layout diagram is hierarchical and includes modules which carry out higher-level functions in accordance with the semiconductor device's design specifications. The modules are often built from a combination of cells, each of which represents one or more semiconductor structures configured to perform a specific function. Cells having pre-designed layout diagrams, sometimes known as standard cells, are stored in standard cell libraries (hereinafter "libraries" or "cell libraries" for simplicity) and accessible by various tools, such as electronic design automation (EDA) tools, to generate, optimize and verify designs for ICs.

Layout diagrams are generated in a context of design rules. A set of design rules imposes constraints on the placement of corresponding patterns in a layout diagram, e.g., geographic/spatial restrictions, connectivity restrictions, or the like. Often, a set of design rules includes a subset of design rules pertaining to the spacing and other interactions between patterns in adjacent or abutting cells where the patterns represent conductors in a layer of metallization. Routing and placing is where the different semiconductor devices in an IC device are connected. One of the goals of routing and placing in a layout is to reduce the amount of routing required and thereby improve power and space consumed by a semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2C are schematic views at various layers of a layout diagram of a cell, and FIG. 2D is a schematic view of the layout diagram of the cell including the layers in FIGS. 2A-2C, in accordance with some embodiments.

FIGS. 11A-11I are each a schematic cross-sectional view of a layout diagram of a filler cell, in accordance with some embodiments.

FIGS. 13A-13C are flowcharts of various methods, in accordance with some embodiments.

DETAILED DESCRIPTION

Figure 1:
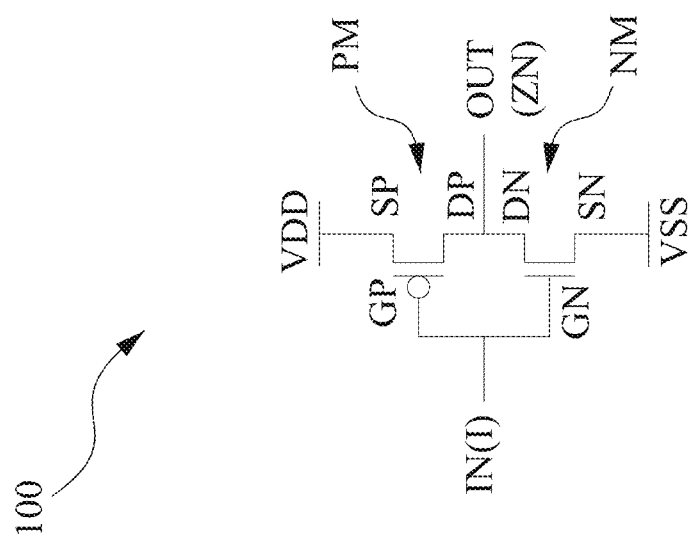
FIG. 1 is a circuit diagram of a cell, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A cell has one or more active regions and gate regions electrically coupled to form internal circuitry of the cell. At an upper metal layer (also referred to as "pin access layer"), the cell includes one or more input/output (IO) pins (also referred to as "IO patterns") configured to electrically couple the internal circuitry inside the cell to external circuitry outside the cell. The cell has a boundary in which the one or more IO patterns are arranged. In some embodiments, at least one side or edge of the boundary and at least one IO pattern of the cell are slanted or oblique to the gate regions and/or the active regions. As a result, in at least one embodiment, it becomes easier to access, or electrically couple, to the oblique IO pattern from a further metal layer over the pin access layer. This is an improvement over other approaches in which cell boundaries are rectangular and IO patterns are oriented parallel to active regions or gate regions.

FIG. 1 is a circuit diagram of a cell 100, in accordance with some embodiments. In FIG. 1, the cell 100 is an inverter. This is an example, and other cells are within the scope of various embodiments. For example, in various embodiments, the cell 100 is a function cell, an engineering change order (ECO) cell, a physical cell, a filler cell, or another type of cell or combination of cells capable of being defined in an IC layout diagram.

A function cell is a cell pre-designed to provide a specific function to an IC incorporating such a function cell. Examples of function cells include, but are not limited to, a logic gate cell, a memory cell, or the like. Examples of logic gate cells include, but are not limited to, AND, OR, NAND, NOR, XOR, INV, AND-OR-Invert (AOI), OR-AND-Invert (OAI), MUX, Flip-flop, BUFF, Latch, delay, clock, or the like. Examples of memory cells include, but are not limited to, a static random access memory (SRAM), a dynamic RAM (DRAM), a resistive RAM (RRAM), a magnetoresistive RAM (MRAM), a read only memory (ROM) cell, or another type of cell capable of having multiple states representative of logical values.

An ECO cell is a cell pre-designed without a specific function, but is programmable to provide an intended function. For example, to design an IC, the pre-designed layouts of one or more function cells are read out from a standard cell library and placed into an initial IC layout. The IC layout also includes one or more ECO cells which are not yet connected or routed to the function cells. When the IC layout is to be revised, one or more of the already placed ECO cells are programed to provide an intended function and routed to the function cells. The programing of ECO cells involves modifications in one or more layers of the IC layout and/or masks for manufacturing the IC.

A physical cell is a cell configured to provide a function, other than a logic function, to an IC incorporating such physical cell. Examples of physical cells include, but are not limited to, a TAP cell, a DCAP cell, or the like. A TAP cell defines a region in a doped well where the doped well is coupled to a bias voltage, such as a power supply voltage. TAP cells are included in an IC layout diagram, e.g., to improve latch-up immunity of ICs manufactured in accordance with the IC layout diagram. A DCAP cell includes one or more decoupling capacitors (decap) between power buses or rails, e.g., as a charge reservoir to provide additional power in situations where there is a high demand for current from the power supply.

A purpose of filler cells is to fill an empty space in an IC layout diagram, for example, to satisfy one or more design rules, such as a minimum spacing between adjacent features. In some embodiments, a physical cell is placed as a filler cell. In at least one embodiment, a filler cell is a cell with no logical functionality that is not connected or routed to other cells in an IC layout diagram. Cells other than filler cells are referred to herein as "non-filler cells."

In the example circuit diagram in FIG. 1, the inverter in the cell 100 comprises a p-channel metal-oxide semiconductor (PMOS) transistor PM and an n-channel metal-oxide semiconductor (NMOS) transistor NM coupled in series between a first power supply voltage VDD and a second power supply voltage VSS. Specifically, the transistor PM comprises a gate region GP, a source region SP, and a drain region DP. The transistor NM comprises a gate region GN, a source region SN, and a drain region DN. The gate regions GP, GN are coupled to an input node IN, also referred to herein or indicated in the drawings as "I." The drain regions DP, DN are coupled to an output node OUT, also referred to herein or indicated in the drawings as "ZN." The source region SP is coupled to VDD, and the source region SN is coupled to VSS. In at least one embodiment, VDD is a positive power supply voltage, and VSS is a ground voltage. The inverter is configured to invert a signal at the input node IN and to output the inverted signal at the output node OUT. Other types of transistors are within the scopes of various embodiments, as described herein.

Figures 2A, 2B:
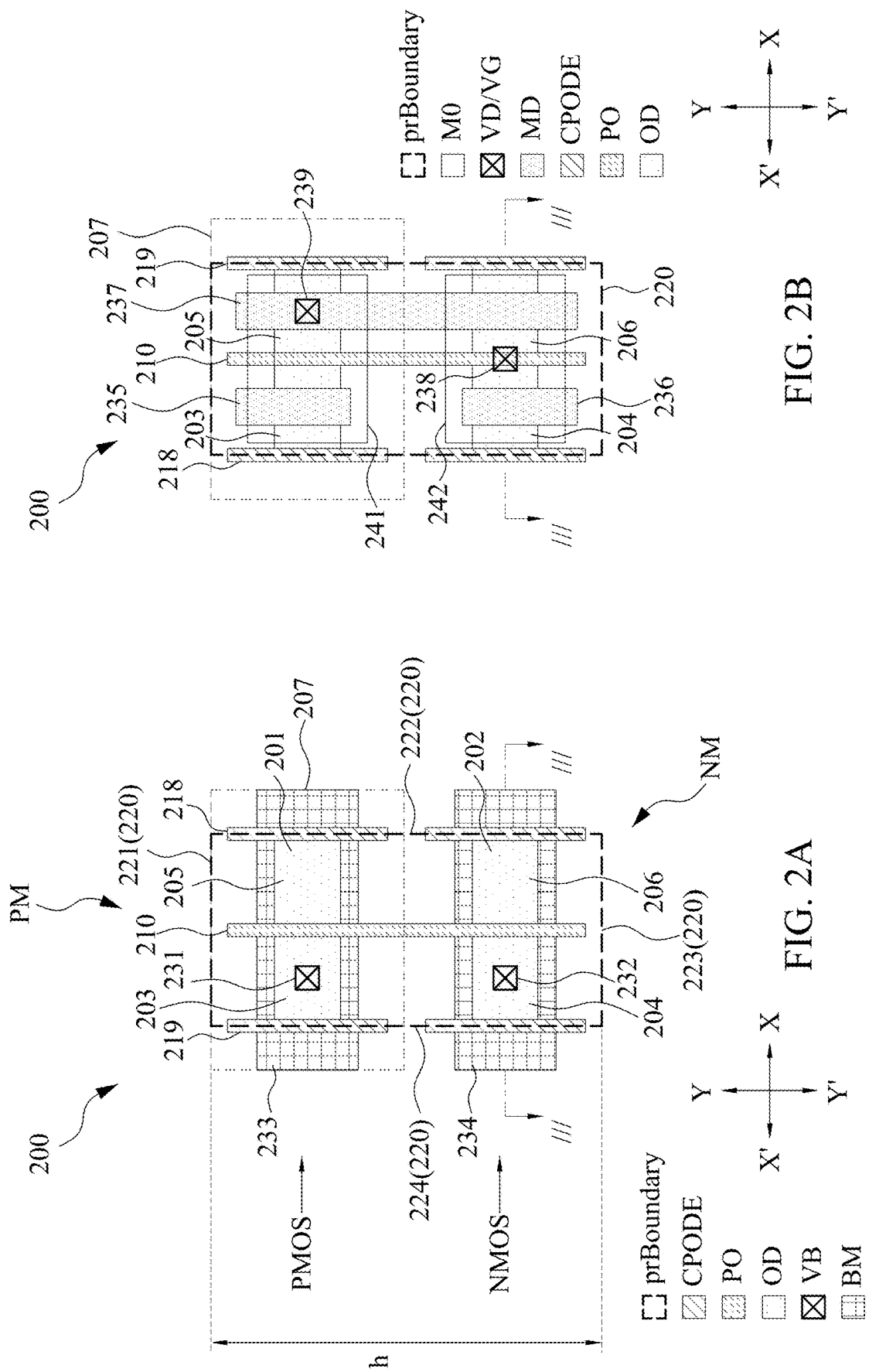

FIGS. 2A-2C are schematic views at various layers of a layout diagram of a cell 200, in accordance with some embodiments. FIG. 2D is a schematic view of the layout diagram of the cell 200 including the layers in FIGS. 2A-2C. In at least one embodiment, the layout diagram of the cell 200 in FIG. 2D is stored as a standard cell in a standard cell library on a non-transitory computer-readable medium. The cell 200 is an inverter corresponding to the cell 100. In the example configuration in FIGS. 2A-2D, the cell 200 is an inverter with a driving strength of 1, also referred to as "INVD1." Other example inverter cells with different driving strengths are herein, e.g., described with respect to FIGS. 6A-6C.

FIG. 2B is a schematic view showing several layers of the cell 200. In FIG. 2A, the cell 200 comprises at least one active region, at least one gate region extending across the at least one active region, and a first boundary in which the at least one active region and the at least one gate region are arranged. For example, the cell 200 comprises active regions 201, 202, a gate region 110, and a first boundary 220.

The active regions 201, 202 are arranged inside the first boundary 220, and extend along a first axis, i.e., X-X' axis. Active regions are sometimes referred to as oxide-definition (OD) regions, and are schematically illustrated in the drawings with the label "OD." In an IC device comprising the cell 200 in accordance with at least one embodiment, the active regions 201, 202 are over a first side, or a front side, of a substrate as described herein. The active regions 201, 202 include P-type dopants and/or N-type dopants to form one or more circuit elements or devices. Examples of circuit elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, P-channel and/or N-channel field effect transistors (PFETs/NFETs), etc.), FinFETs, planar MOS transistors with raised source/drains, nanosheet FETs, nanowire FETs, or the like. An active region configured to form one or more PMOS devices therein is referred to herein as "PMOS active region," and is schematically indicated in the drawings with the label "PMOS." An active region configured to form one or more NMOS devices therein is referred to herein as "NMOS active region," and is schematically indicated in the drawings with the label "NMOS." In embodiments described herein, a PMOS active region is replaceable with an NMOS active region, and vice versa.

The gate region 210 is arranged inside the first boundary 220, and extends across the active regions 201, 202 along a second axis, i.e., Y-Y' axis, which is transverse to the X-X' axis. In at least one embodiment, the Y-Y' axis is perpendicular to the X-X' axis. The gate region 210 includes a conductive material, such as, polysilicon, and is schematically illustrated in the drawings with the label "PO." Other conductive materials for the gate region, such as metals, are within the scope of various embodiments.

In the example configuration in FIG. 2A, the active region 201 is a PMOS active region inside an N well 207 and configured to form, together with the gate region 210, the transistor PM of the inverter as described with respect to FIG. 1. The active region 202 is an NMOS active region configured to form, together with the gate region 210, the transistor NM of the inverter as described with respect to FIG. 1. Specifically, the active region 201 comprises a source region 203 and a drain region 205 on opposite sides of a first section of the gate region 210 which extends over the active region 201. The source region 203, the drain region 205 and the first section of the gate region 210 correspond to the source region SP, the drain region DP, and the gate region GP described with respect to FIG. 1. The active region 202 comprises a source region 204 and a drain region 206 on opposite sides of a second section of the gate region 210 which extends over the active region 202. The source region 204, the drain region 206 and the second section of the gate region 210 correspond to the source region SN, the drain region DN, and the gate region GN described with respect to FIG. 1.

The source regions 203, 204 are configured to be electrically coupled correspondingly to VDD and VSS power rails on a second side, or a back side, of the substrate. For example, through vias 231, 232 are arranged to be overlapped correspondingly by the source regions 203, 204, and configured to extend through the substrate of an IC device comprising the cell 200. The through vias 231, 232 are configured to be in electrical contact with the back sides of the corresponding source regions 203, 204, as described herein. A through via is sometimes referred to as a backside via, and is schematically illustrated in the drawings with the label "VB." The through vias 231, 232 are configured to electrically couple the corresponding source regions 203, 204 to corresponding conductive patterns 233, 234 in a backside-metal (BM) layer which is schematically illustrated in the drawings with the label "BM." The BM conductive pattern 233 is configured as a VDD power rail on the back side of the substrate, and the BM conductive pattern 234 is configured as a VSS power rail on the back side of the substrate. An example material of the through vias and BM conductive patterns includes metal. Other configurations are within the scopes of various embodiments.

The first boundary 220 comprises edges 221, 222, 223, 224 connected together to form a closed boundary. In a place-and-route operation (also referred to as "automated placement and routing (APR)") described herein, cells are placed in an IC layout diagram in abutment with each other at their respective boundaries. For example, the cell 200 is placed in abutment with one or more other cells along the X-X' axis at one or more of the edges 221, 223. Additionally or alternatively, the cell 200 is placed in abutment with one or more other cells along the Y-Y' axis at one or more of the edges 222, 224. The first boundary 220 is sometimes referred to as "place-and-route boundary" and is schematically illustrated in the drawings with the label "prBoundary." In the example configuration in FIG. 2A, the first boundary 220 has a rectangular shape, with the edges 221, 223 parallel to the X-X' axis, and the edges 222, 224 parallel to the Y-Y' axis. The edge 221 coincides with a top edge of the N well 207 in FIG. 2A. Other configurations are within the scopes of various embodiments. Between the edges 221, 223 and along the Y axis, the cell 200 contains one PMOS active region, i.e., 201, and one NMOS active region, i.e., 202, and is considered to have a height corresponding to one cell height h. In some embodiments, another cell containing along the Y axis two PMOS active regions and two NMOS active regions is considered to have a height corresponding to two cell heights, or double cell height, 2h.

The cell 200 further comprises dummy gate regions 218, 219 along the corresponding edges 222, 224 of the first boundary 220. In at least one embodiment, centerlines of the dummy gate regions 218, 219 coincide with the corresponding edges 222, 224 of the first boundary 220. Dummy gate regions are schematically illustrated in the drawings with the label "CPODE." The gate region 210 is an example of "functional gate regions" which, together with the underlying active regions, configure transistors and/or are electrically coupled to one or more other circuit elements. Unlike functional gate regions, dummy gate regions, or non-functional gate regions, are not configured to form transistors together with underlying active regions, and/or one or more transistors formed by dummy gate regions together with the underlying active regions are not electrically coupled to other circuit elements. In at least one embodiment, dummy gate regions include dielectric material in a manufactured IC device. In some embodiments, dummy gate regions and functional gate regions are arranged at the same pitch, i.e., a center-to-center distance, along the X-X' axis. In the example configuration in FIG. 2A, each of the dummy gate regions 218, 219 has disconnected sections separated from each other along the Y-Y' axis. Other configurations are within the scope of various embodiments. In a place-and-route operation when the cell 200 is placed to abut other cells, the dummy gate regions 218, 219 along the edges 222, 224 of the first boundary 220 are merged with corresponding dummy gate regions of the other cells.

The described configuration of the cell 200 comprising two active regions 201, 202 directly adjacent each other along the Y-Y' axis is an example. Other cells in various embodiments include other numbers of active regions arranged along the Y-Y' axis. Two active regions are directly adjacent along the Y-Y' axis when there are no other active regions therebetween. In the example configuration in FIG. 2A, each of the active regions 201, 202 has, along the X-X' axis, opposite edges (not numbered) coinciding with the edges 222, 224 of the first boundary 220. Other configurations are within the scope of various embodiments. The cell 200 comprises a single gate region 210. This is an example, and other cells in various embodiments include more than one gate regions.

FIG. 2B is a schematic view showing further layers of the cell 200 above the active regions 201, 202 and the gate region 210. Compared to FIG. 2A, the VB through vias 231, 232 and the BM conductive patterns 233, 234 are omitted in FIG. 2B, for simplicity.

In FIG. 2B, the cell 200 further comprises contact structures over and in electrical contact with the corresponding source/drain regions in the active regions 201, 202. Contact structures are sometimes referred to as metal-to-device structures, and are schematically illustrated in the drawings with the label "MD." An MD contact structure includes a conductive material formed over a corresponding source/drain region in the corresponding active region to define an electrical connection from one or more devices formed in the active region to other circuitry. In the example configuration in FIG. 2B, MD contact structures 235, 236 are over and in electrical contact with the corresponding source regions 203, 204, and an MD contact structure 237 extends continuously along the Y-Y' axis to be over and in electrical contact with both corresponding drain regions 205, 206. The MD contact structure 237 electrically couples the drain regions 205, 206 together. In some embodiments, MD contact structures and gate regions (including both functional and dummy gate regions) are arranged alternatingly along the X-X' axis. A pitch, i.e., a center-to-center distance along the X-X' axis, between directly adjacent MD contact structures is the same as the pitch between directly adjacent gate regions. Two gate regions (including functional and/or dummy gate regions) are considered directly adjacent along the X-X' axis where there are no other gate regions (including functional and/or dummy gate regions) therebetween. Two MD conductive patterns are considered directly adjacent along the X-X' axis where there are no other MD conductive patterns therebetween. An example conductive material of MD contact structures includes metal. Other configurations are within the scopes of various embodiments.

The cell 200 further comprises vias over and in electrical contact with the corresponding gate regions or MD contact structures. A via over and in electrical contact with an MD contact structure is sometimes referred to as via-to-device (VD). A via over and in electrical contact with a gate region is sometimes referred to as via-to-gate (VG). VD and VG vias are schematically illustrated in the drawings with the label "VD/VG." In the example configuration in FIG. 2B, a VG via 238 is over and in electrical contact with the gate region 210, and a VD via 239 is over and in electrical contact with the MD contact structure 237. An example material of the VD and VG vias includes metal. Other configurations are within the scopes of various embodiments.

The cell 200 further comprises one or more metal layers and via layers sequentially and alternatingly arranged over the VD and VG vias. The lowermost metal layer immediately over and in electrical contact with the VD and VG vias is a metal-zero (M0) layer, a next metal layer immediately over the M0 layer is a metal-one (M1) layer, or the like. A via layer Vn is arranged between and electrically couple the Mn layer and the Mn+1 layer, where n is an integer form zero and up. For example, a via-zero (V0) layer is the lowermost via layer which is arranged between and electrically couple the M0 layer and the M1 layer. Other via layers are V1, V2, or the like.

The M0 layer is the lowermost metal layer over, or the closest metal layer to, the active regions on the front side of the substrate, as described herein. In some embodiments, all conductive patterns in the M0 layer belong to the same mask. In at least one embodiment, the conductive patterns in the M0 layer are separated into several masks to meet one or more design and/or manufacturing requirements. At the M0 layer, the cell 200 comprises M0 conductive patterns 241, 242 correspondingly over the active regions 201, 202. In some embodiments, the M0 conductive pattern 241 belongs to one mask, and the M0 conductive pattern 242 belong to another masks. The M0 conductive pattern 241 overlaps and is electrically coupled to the VD via 239, and the M0 conductive pattern 242 overlaps and is electrically coupled to the VG via 238. As a result, the M0 conductive pattern 241 is electrically coupled to the drain regions 205, 206 through the MD contact structure 237 and the VD via 239, and the M0 conductive pattern 242 is electrically coupled to the gate region 210 through the VG via 238. The MD conductive patterns 235, 236 are not electrically coupled to the M0 layer or another metal layer above the M0 layer, and are provided to satisfy one or more design rules, in one or more embodiments. In the example configuration in FIG. 2B, each of the M0 conductive patterns 241, 242 has opposite edges (not numbered) along the X-X' axis which are spaced from the adjacent dummy gate regions 218, 219. In other words, the M0 conductive patterns 241, 242 are completely arranged inside the first boundary 220.

In some embodiments, along the Y-Y' axis and within one cell height h, the cell 200 includes no more than three rows of M0 conductive patterns. In the example configuration in FIG. 2B, the cell 200 includes two rows each extending along the X-X' axis and containing a corresponding one of the M0 conductive patterns 241, 242. The two rows are considered directly adjacent along the Y-Y' axis as there are no other rows of M0 conductive patterns therebetween. In at least one embodiment (not shown), an additional row of M0 conductive patterns is arranged along the Y-Y' axis between the two rows containing the M0 conductive patterns 241, 242. For example, the additional row of M0 conductive patterns is arranged over a region between the active regions 201, 202. In at least one embodiment, by arranging no more than three rows of M0 conductive patterns over one cell height h, it is possible to reduce the area cost of IC devices.

FIG. 2C is a schematic view showing further layers of the cell 200. Compared to FIG. 2B, the M0 conductive patterns 241, 242, the MD contact structures 235, 236, 237, and the VD/VG vias 238, 239 are omitted in FIG. 2C, for simplicity.

The cell 200 further comprises, in the V0 layer over the M0 layer, V0 vias 243, 244 over and in electrical contact with the corresponding M0 conductive patterns 241, 242. The cell 200 further comprises, in the M1 layer over the V0 layer, M1 conductive patterns 245, 246 over and in electrical contact with the corresponding V0 vias 243, 244. As a result, the M1 conductive pattern 245 is electrically coupled to the drain regions 205, 206 through the MD contact structure 237, the VD via 239, the M0 conductive pattern 241 and the V0 vias 243. The M1 conductive pattern 245 corresponds to the output ZN of the cell 100 described with respect to FIG. 1. The M1 conductive pattern 246 is electrically coupled to the gate region 210 through the VG via 23, the M0 conductive pattern 242 and the V0 vias 244. The M1 conductive pattern 246 corresponds to the input I of the cell 100 described with respect to FIG. 1. The M1 conductive patterns 245, 246 are IO patterns (or IO pins) of the cell 200 that are configured to electrically couple the cell 200 to other circuitry. The M1 layer containing the IO patterns is an example of a pin access layer. Other configurations with other metal layers, such as the M2 layer and/or M3 layer, being the pin access layers are within the scopes of various embodiments. In the example configuration in FIG. 2C, the cell 200 is a simple cell with two 10 patterns in a single pin access layer. In some embodiments, a more complex cell has a higher numbers of inputs and/or outputs, resulting in a higher number of 10 patterns. It is possible that such complex cells include more than one pin access layers, i.e., have the corresponding 10 patterns arranged in more than one metal layers.

The cell 200 further comprises a second boundary 250 in which IO patterns, such as the M1 conductive patterns 245, 246, are arranged. The second boundary 250 comprises edges 251, 252, 253, 254, 255, 256 connected together to form a closed boundary. The opposing edges 251, 254 extend along the X-X' axis and coincide with the corresponding edges 221, 223 of the first boundary 220. The other edges 252, 253, 255, 256 extend obliquely to both the X-X' axis and the Y-Y' axis. For example, the opposing edges 253, 256 extend along a third axis, e.g., U-U' axis, which is oblique to both the X-X' axis and the Y-Y' axis. The opposing edges 252, 255 extend along a fourth axis, e.g., V-V' axis, which is oblique to both the X-X' axis and the Y-Y' axis. The U-U' axis is transverse to the V-V' axis. In one or more embodiments, the U-U' axis is perpendicular, to the V-V' axis. In one or more embodiments, the U-U' axis is oblique, i.e., not perpendicular, to the V-V' axis.

The U-U' axis forms with either of the X-X' axis or the Y-Y' axis an acute angle. For example, as illustrated in FIG. 2C, an angle 257 between the U-U' axis and the Y-Y' axis is an acute angle. The acute angle may be between any one of orientations U, U' and any one of orientations Y, Y'. Similarly, the U-U' axis and the X-X' axis form therebetween an acute angle which may be between any one of orientations U, U' and any one of orientations X, X'. The V-V' axis forms with either of the X-X' axis or the Y-Y' axis an acute angle. For example, the V-V' axis and the Y-Y' axis form therebetween an acute angle 258 which may be between any one of orientations V, V' and any one of orientations Y, Y'. In the example configuration in FIG. 2C, the angles 257, 258 are the same. The V-V' axis and the X-X' axis form therebetween an acute angle which may be between any one of orientations V, V' and any one of orientations X, X'. Any of the described acute angles, e.g., the angle 257 or 258, is greater than 0 degrees, and is smaller than 90 degrees. In some embodiments, the acute angle is between 10 degrees and 80 degrees, or between 20 degrees and 70 degrees, or between 30 degrees and 60 degrees, or between 40 degrees and 50 degrees. In at least one embodiment, the acute angle is 45 degrees.

The IO patterns 245, 246 are arranged within the second boundary 250, and also extend obliquely to the X-X' axis and the Y-Y' axis. In the example configuration in FIG. 2C, the IO patterns 245, 246 are parallel to each other, and also parallel to the edges 253, 256 of the second boundary 250. In other words the IO patterns 245, 246 extend along the U-U' axis. Other configurations where the IO patterns are not necessarily parallel to an edge or edges of the second boundary 250 are within the scopes of various embodiments. In the example configuration in FIG. 2C, the IO patterns 245, 246 have the same width w in a direction perpendicular to a lengthwise direction of the IO patterns 245, 246, i.e., in a direction perpendicular to the U-U' axis.

In some embodiments where IO patterns are arranged in different metal layers or pin access layers, IO patterns in one pin access layer are transverse to IO patterns in another pin access layer. For example, assuming that in addition to the IO patterns 245, 246 in the M1 layer, the cell 200 has further IO patterns arranged in the M2 layer, the further IO patterns in the M2 layer extend along the V-V' axis to transverse the IO patterns 245, 246 in the M1 layer, in accordance with some embodiments.

In some embodiments, conductive patterns in each metal layer below the pin access layer(s), i.e., the metal layer(s) containing IO patterns of a cell, extend along the X-X' axis or the Y-Y' axis. For example, in embodiments where the pin access layer is the M3 layer, the metal layers M0 and M2 have conductive patterns extending along the X-X' axis, whereas the metal layer M1 has conductive patterns extending along the Y-Y' axis. In at least one embodiment, conductive patterns in one or more or all metal layers above the pin access layer(s) extend along the X-X' axis or the Y-Y' axis. For example, when the pin access layer is the M1 layer, for example, as in FIG. 2C, conductive patterns in the M2 layer extend along the X-X' axis in one or more embodiments, or extend along the Y-Y' axis in one or more further embodiments. In some embodiments, each of the IO patterns 245, 246 is completely arranged within the second boundary 250. In some embodiments, the pin access layer(s) of a cell is/are the topmost metal layer(s) of the cell. In one or more embodiments, IO patterns of a cell are arranged in non-consecutive metal layers. The described configurations of the IO patterns and the corresponding pin access layer(s) are examples. Other configurations are within the scope of various embodiments.

As described herein, the cell 200 comprises a first boundary 220 and a second boundary 250. In some embodiments, the first boundary 220 contains therein various layers and features of the cell 200 on the front side of a substrate up to, but not including, a pin access layer. The second boundary 250 contains therein at least IO patterns of the cell 200 in one or more pin access layers. The first boundary 220 and second boundary 250 overlap one another, and have different shapes. A first edge of the first boundary 220 and a second edge of the second boundary 250 overlap each other and form therebetween an acute angle. For example, the edge 222 of the first boundary 220 overlaps the edge 253 of the second boundary 250, and an acute angle corresponding to the angle 257 is formed between the edge 222 of the first boundary 220 and the edge 253 of the second boundary 250. For another example, the edge 222 of the first boundary 220 overlaps the edge 252 of the second boundary 250, and an acute angle corresponding to the angle 258 is formed between the edge 222 of the first boundary 220 and the edge 252 of the second boundary 250. As shown in FIG. 2C, the dummy gate region 219 arranged along the edge 222 of the first boundary 220 extends from inside the second boundary 250, across the edge 252 or 253 of the second boundary 250, to outside the second boundary 250. The dummy gate region 218 arranged along the edge 224 of the first boundary 220 extends from inside the second boundary 250, across the edge 255 or 256 of the second boundary 250, to outside the second boundary 250.

The described and illustrated shape(s) of the first boundary 220 and/or the second boundary 250 is/are examples. Other configurations are within the scopes of various embodiments. For example, in at least one embodiment, the first boundary 220 has a shape other than a rectangular shape. For further examples, although the second boundary 250 is described to have a shape of a convex hexagon, in one or more embodiments, the second boundary 250 has a shape of a concave hexagon, as described herein.

In some embodiments, in a place-and-route operation as described herein, when the cell 200 is placed in abutment with a further cell so that the first boundary 220 of the cell 200 abuts a corresponding first boundary of the further cell, the second boundary 250 of the cell 200 also abuts, at the same time, a corresponding second boundary of the further cell.

In some embodiments, various layers and features on the front side of a substrate are manufactured in a front-end-of-line (FEOL) stage, and are sometimes referred to as FEOL layers and features. Layers and features other than the FEOL layers and features, are manufactured in a back-end-of-line (BEOL) stage, and are sometimes referred to as BEOL layers and features. Example FEOL layers and features include, but are not limited to, N- and P-wells, active regions, gate regions including both functional and dummy gate regions, MD contact structures, VD and VG vias, and M0 conductive patterns. FEOL layers and features are arranged inside a first boundary, such as the first boundary 220. Example BEOL layers and features include, but are not limited to, metal layers and via layers above the FEOL layers and features, as well as metal layers and via layers on the back side of the substrate. Pin access layers of cells are examples of BEOL layers and are arranged inside a second boundary, such as the second boundary 250. In the example configuration in FIGS. 2A-2C, the schematic views in FIGS. 2A-2B show FEOL layers and features of the cell 200, and the schematic view in FIG. 2C show BEOL layers and features of the cell 200, in accordance with some embodiments.

FIG. 2D is a schematic view of the layout diagram of the cell 200 including the layers in FIGS. 2A-2C, in accordance with some embodiments. The schematic view in FIG. 2D is a combination of the schematic views in FIGS. 2A-2C. For simplicity, the first boundary 220 and the VB via 231 are omitted in FIG. 2D.

In other approaches with IO patterns parallel to active regions or gate regions, pin access during APR is a design consideration, especially as ICs are increasingly miniaturized at greater scales. For example, one or more access points for accessing a pin or IO pattern of a cell are not usable due to existing metal tracks and/or due to one or more other neighboring cells blocking the access points. An attempt to solve this issue includes increasing the number of M0 tracks, or rows of M0 conductive patterns, in the cell; however, such attempt increases the cell height which, in turn, potentially leads to degradation in one or more of performance, power and area (PPA).

In some embodiments, by arranging the IO patterns at an acute angle to the gate regions, it is possible to provide more access points to the IO patterns without having to increase the number of M0 tracks in a cell. As a result, pin access challenges are resolvable, while maintaining or even achieving PPA improvements, in at least one embodiment. As described herein, in some embodiments, there are no more than three M0 tracks over a cell height which contributes to reduction of the area cost, with further associated advantages. In at least one embodiment, by providing a different boundary for at least oblique IO patterns, a place-and-route operation for cells having oblique IO patterns is facilitated.

Figure 3:
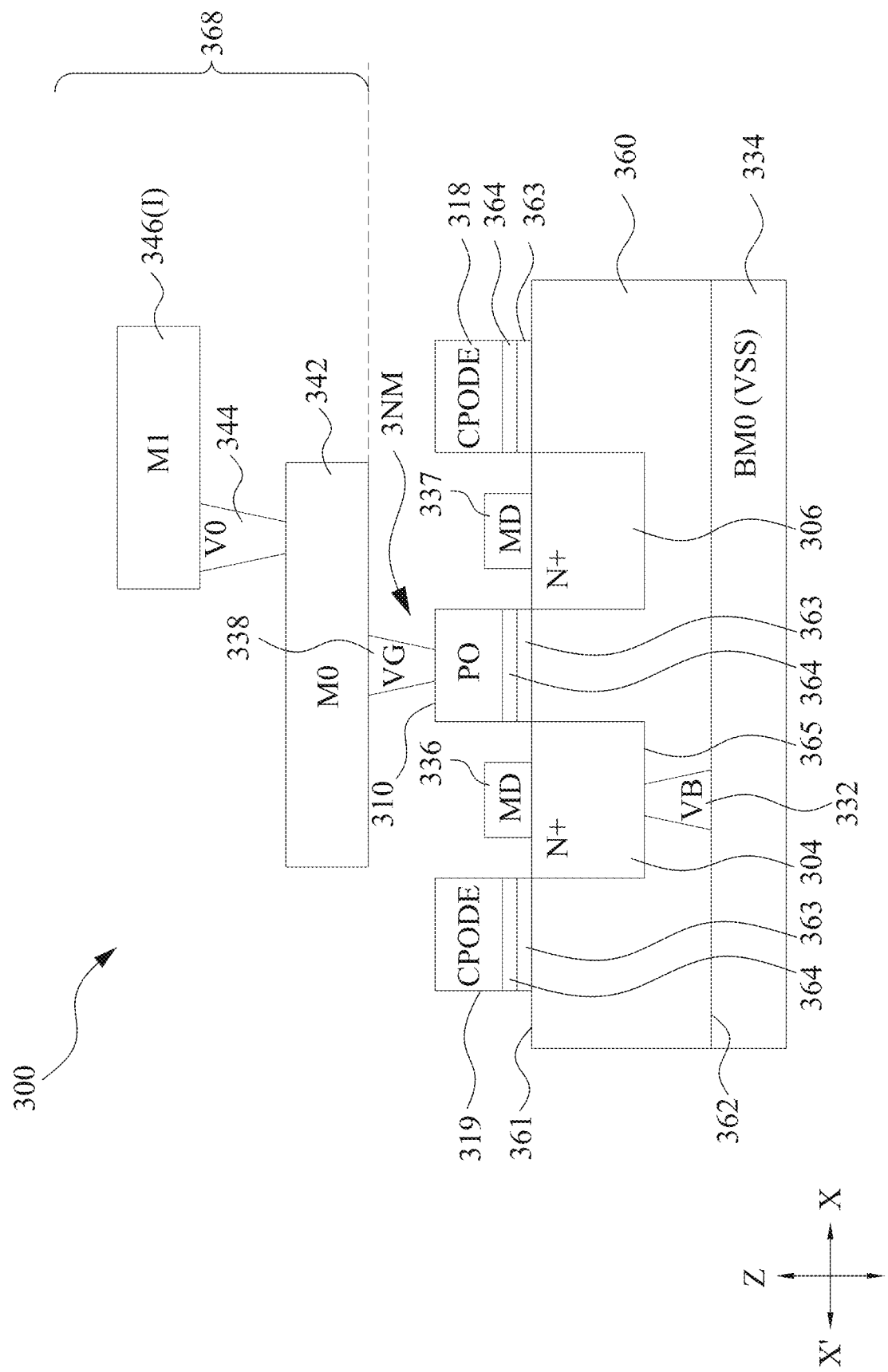
FIG. 3 is a schematic cross-sectional view, taken along lines III-III in FIGS. 2A-2D, of an IC device, in accordance with some embodiments.

FIG. 3 is a schematic cross-sectional view, taken along lines III-III in FIGS. 2A-2D, of an IC device 300, in accordance with some embodiments. The IC device 300 comprises, in FIG. 3, an inverter corresponding to the cell 200 described with respect to FIGS. 2A-2D. Components in FIG. 3 having corresponding components in FIGS. 2A-2D are designated by the reference numerals of FIGS. 2A-2D increased by 100. For example, the MD contact structure 236 in FIG. 2B corresponding to an MD contact structure 336 in FIG. 3.

As shown in FIG. 3, the IC device 300 comprises a substrate 360 over which circuit elements and structures corresponding to the cell 200 are formed. The substrate 360 has a first side 361 and a second side 362 opposite one another along a thickness direction of the substrate 360, i.e., along a Z-Z' axis. In at least one embodiment, the first side 361 is referred to as "upper side" or "front side" or "device side," whereas the second side 362 is referred to as "lower side" or "back side." The substrate comprises, in at least one embodiment, silicon, silicon germanium (SiGe), gallium arsenic, or other suitable semiconductor or dielectric materials.

N-type and P-type dopants are added to the front side 361 of the substrate 360 to correspondingly form N wells in an NMOS active region, and P wells in a PMOS active region. For example, N wells 304, 306 are formed over the front side 361 of the substrate 360, and correspond to the source region 204 and drain region 206 in FIGS. 2A-2B. The N wells 304, 306 configure source/drain regions of a transistor 3NM corresponding to the transistor NM in FIG. 2A. In some embodiments, isolation structures are formed between adjacent P wells and N wells. For simplicity, isolation structures are omitted from FIG. 3. A gate of the transistor 3NM comprises a stack of gate dielectric layers 363, 364, and a gate electrode 310. Similar stacks of gate dielectric layers 363, 364 are formed under dummy gate electrodes 318, 319 on opposite sides of the gate electrode 310 along the X-X' axis. In at least one embodiment, each of the described stack of gate dielectric layers is replaced with a gate dielectric layer instead of multiple gate dielectrics. Example materials of the gate dielectric layer or layers include HfO2, ZrO2, or the like. Example materials of the gate electrodes include polysilicon, metal, or the like. In some embodiments, the dummy gate electrodes 318, 319 include dielectric materials.

The IC device 300 further comprises MD contact structures for electrically coupling source/drains of transistors to other circuit elements. In FIG. 3, MD contact structures comprise MD contact structures 336, 337 correspondingly over and in electrical contact with the N wells or source/drain regions 304, 306. Further, VD vias (not shown in FIG. 3) and VG vias are correspondingly over and in electrical contact with the MD contact structures and gate electrodes. For example, as shown in FIG. 3, a VG via 338 corresponding to the VG via 238 is over and in electrical contact with the gate electrode 310.

The IC device 300 further comprises an interconnect structure 368 which is over the VD and VG vias, and comprises a plurality of metal layers M0, M1, . . . and a plurality of via layers V0, V1, . . . arranged alternatingly in the thickness direction of the substrate 360, i.e., along the Z-Z' axis. The interconnect structure 368 further comprises various interlayer dielectric (ILD) layers (not shown) in which the metal layers and via layers are embedded. The metal layers and via layers of the interconnect structure 368 are configured to electrically couple various elements or circuits of the IC device 300 with each other, and with external circuitry. For simplicity, metal layers and via layers above the M1 layer are omitted in FIG. 3. The M0 layer comprises an M0 conductive pattern 342 corresponding to the M0 conductive pattern 242 in FIGS. 2B-2C, over and in electrical contact with the VG via 338. The V0 layer comprises a V0 via 344 corresponding to the V0 via 244 in FIG. 2C, over and in electrical contact with the M0 conductive pattern 342. The M1 layer comprises an M1 conductive pattern 346 corresponding to the M1 conductive pattern 246 in FIG. 2C, over and in electrical contact with the V0 via 344. The M1 conductive pattern 346 is an IO pattern or IO pin corresponding to the input of the inverter in the cell 200.

The IC device 300 further comprises a VB through via 332 corresponding to the VB through via 232 in FIG. 2A. The VB through via 332 extends from the back side 362 of the substrate 360 towards the front side 361, to be in electrical contact with a back side 365 of the N well 304.

The IC device 300 further comprises a backside-metal layer, such as a backside-metal-zero (BM0) layer under the back side 362 of the substrate 360. On the back side 362 of the substrate 360, the BM0 layer is the uppermost metal layer under, or the closest metal layer to, the active regions or source/drains of the transistors of the IC device 300. In the example configuration in FIG. 3, the BM0 layer comprises a conductive pattern 334 under and in electrical contact with the VB through via 332. The conductive pattern 334 is configured as a VSS power rail and corresponds to the BM conductive pattern 234 in FIG. 2A. Other conductive patterns (not shown) of the BM0 layer are configured to as VDD or VSS power rails for delivery of power supply or ground voltages to the circuitry of the IC device 300. In at least one embodiment, the IC device 300 comprises one or more further via layers, dielectric layers and metal layers (not shown) under the BM0 layer to form interconnections among circuit elements of the IC device 300 and/or to form electrical connections to external circuitry. Via layers and metal layers from the BM0 layer and below are sometimes referred to as backside via layers and metal layers. For simplicity, dielectric layers, and backside via and metal layers lower than the BM0 layer are omitted from FIG. 3. In at least one embodiment, one or more advantages described herein are achievable in the IC device 300.

Figure 4:
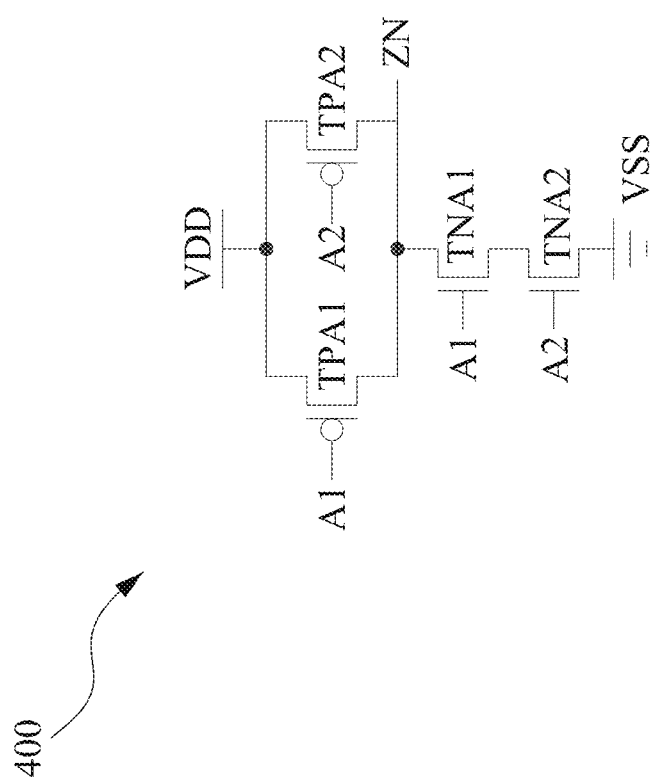
FIG. 4 is a circuit diagram of a cell, in accordance with some embodiments.

FIG. 4 is a circuit diagram of a cell 400, in accordance with some embodiments. In FIG. 4, the cell 400 is a two-input NAND gate. This is an example, and other cells are within the scope of various embodiments.

In the example circuit diagram in FIG. 4, the cell 400 comprises PMOS transistors TPA1, TPA2 and NMOS transistors TNA1, TNA2. The transistors TPA1, TPA2 are coupled in parallel between VDD and an output ZN. The transistors TNA1, TNA2 are coupled in series between the output ZN and VSS. Gates of the transistors TPA1, TNA1 are commonly coupled to a first input A1. Gates of the transistors TPA2, TNA2 are commonly coupled to a second input A2. The cell 400 is configured to perform a NAND logic operation on input signals at the inputs A1, A2, and generate an output signal at the output ZN. In at least one embodiment, the described NMOS transistors are replaced with NMOS transistors, and vice versa.

Figure 5A:
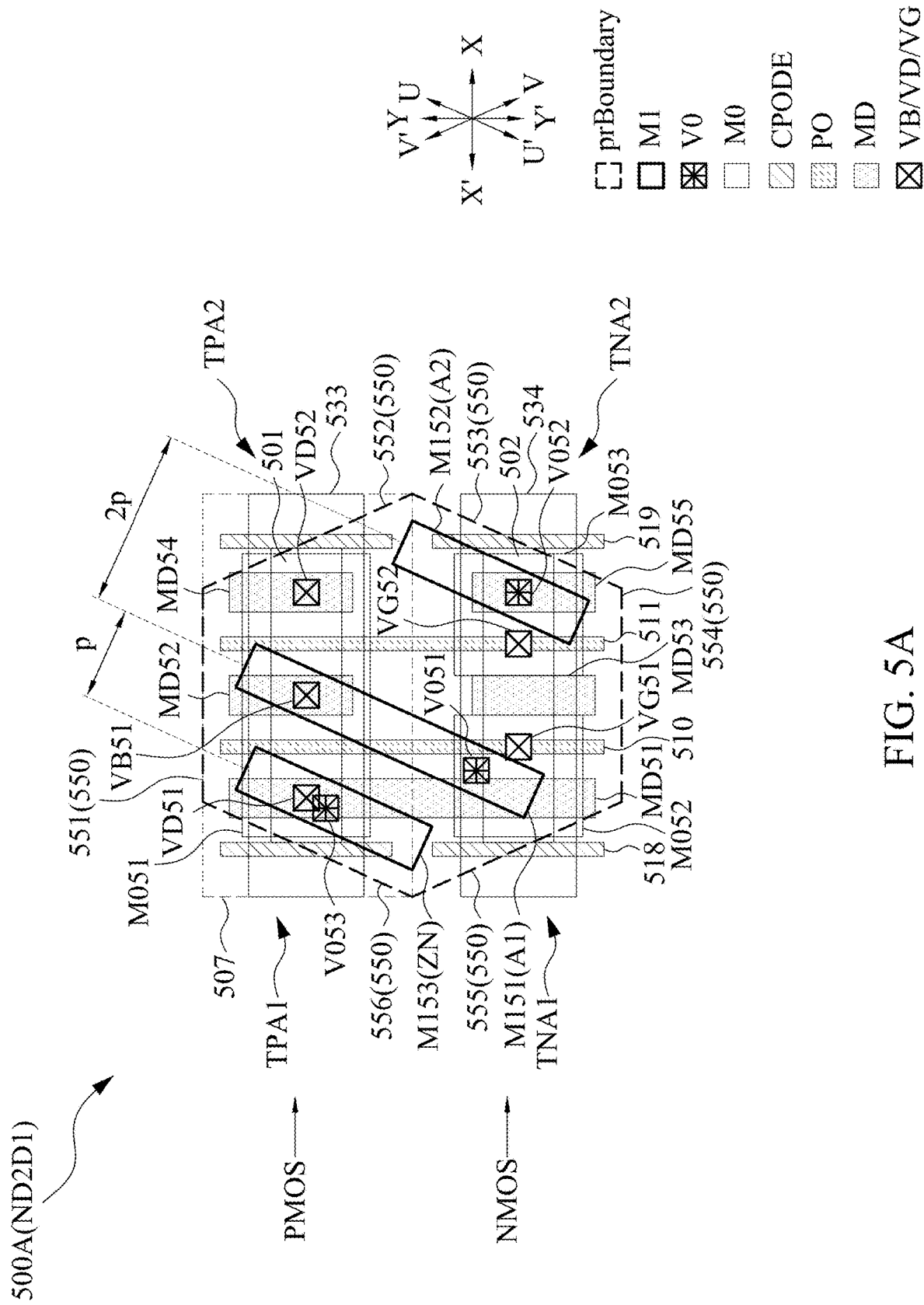
FIGS. 5A-5C are schematic views of layout diagrams of various cell, in accordance with some embodiments.
Figure 5B:
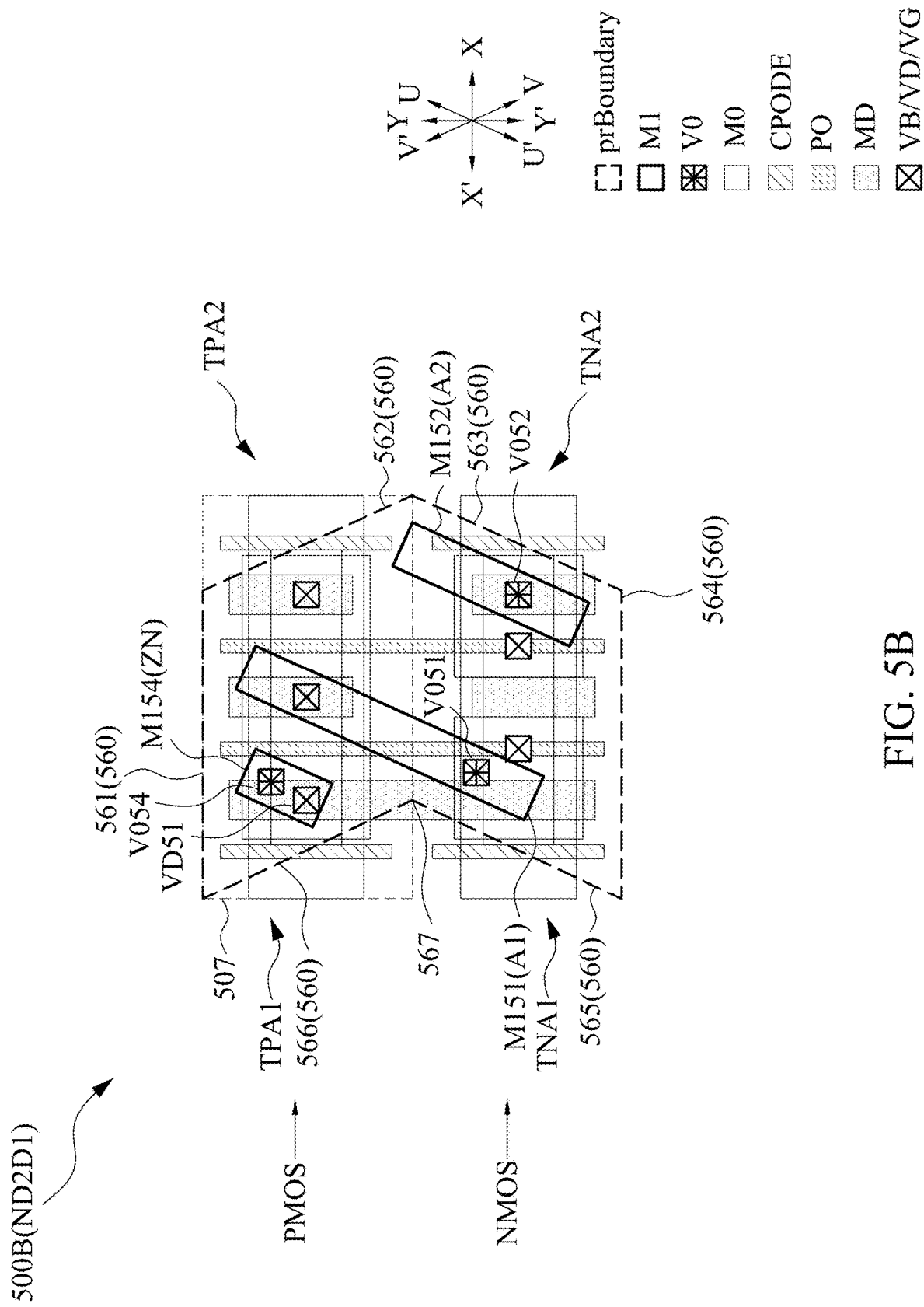
Figure 5C:
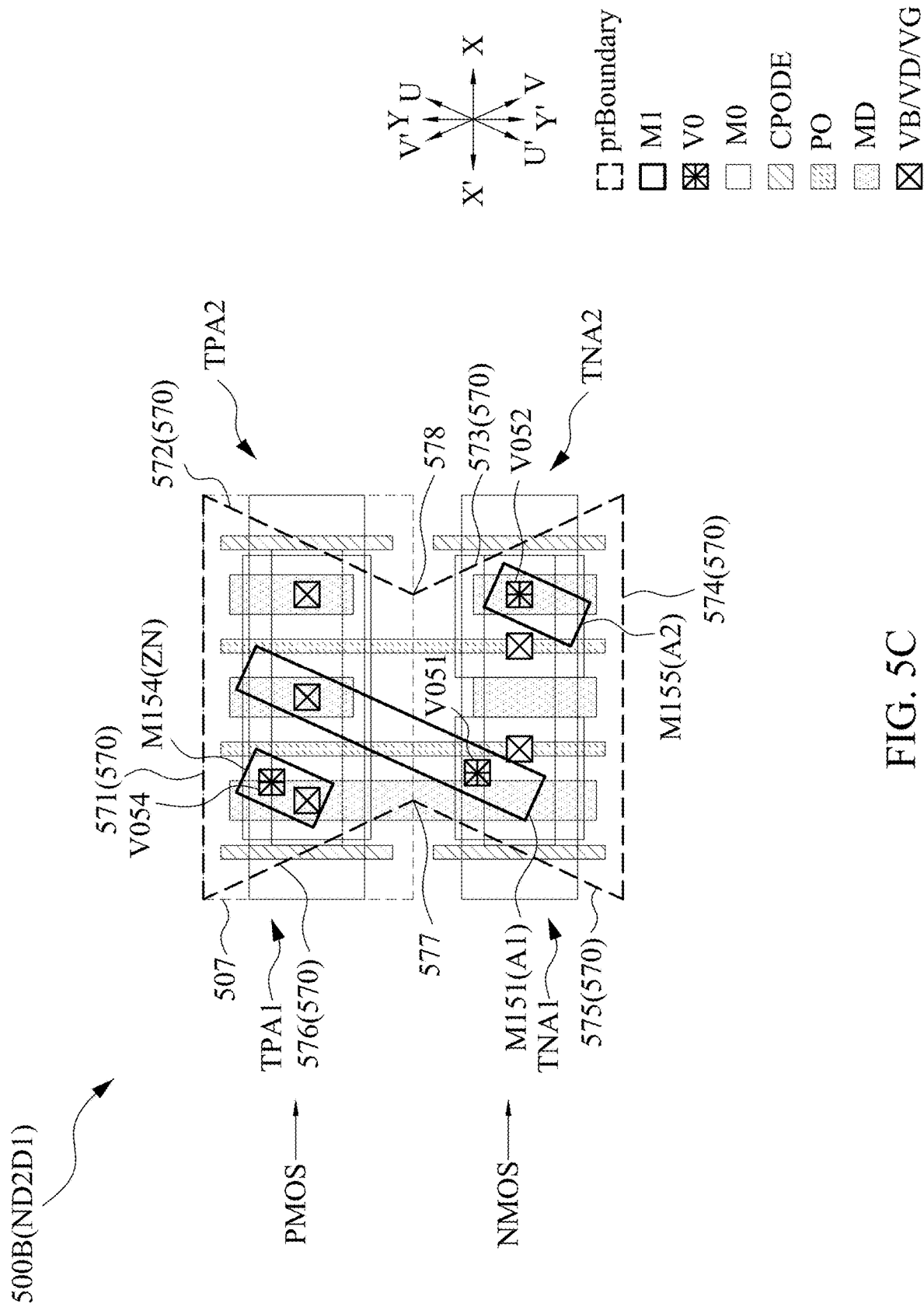

FIGS. 5A-5C are schematic views of layout diagrams of corresponding cells 500A, 500B, 500C, in accordance with some embodiments. In at least one embodiment, the layout diagrams of one or more of the cells 500A-500C are stored as standard cells in a standard cell library on a non-transitory computer-readable medium. The cells 500A-500C are two-input NAND gates corresponding to the cell 400. In the example configuration in FIGS. 5A-5C, the cells 500A-500C are two-input NAND gates with a driving strength of 1, also referred to as "ND2D1." Other example two-input NAND gates with different driving strengths are within the scopes of various embodiments.

In FIG. 5A, the cell 500A comprises active regions 501, 502, functional gate regions 510, 511, dummy gate regions 518, 519. The active regions 501, 502 extend along the X-X' axis. The active region 501 is over an N well 507. The gate region 510 extends across the active regions 501, 502 along the Y-Y' axis and configure, together with the active regions 501, 502, transistors TPA1, TNA1 as described with respect to FIG. 4. The gate region 511 extends across the active regions 501, 502 along the Y-Y' axis and configure, together with the active regions 501, 502, transistors TPA2, TNA2 as described with respect to FIG. 4. A source/drain region of the transistor TPA1 and a source/drain region of the transistor TPA2 are formed in the active region 501 are commonly electrically coupled to a back side VDD power rail 533, by a VB through via VB51. A source/drain region of the transistor TNA2 is electrically coupled to a back side VSS power rail 534, by another VB through via (not shown).

The cell 500A further comprises MD contact structures MD51-MD55, VD vias VD51, VD52, VG vias VG51, VG52, M0 conductive patterns M051-M053, V0 vias V051-V053, and M1 conductive patterns M151-M153. The MD contact structure MD51 is over and in electrical contact with the corresponding source/drain regions of the transistors TPA1, TNA1 in the corresponding active regions 501, 502, and is further electrically coupled to the VD via VD51, then to the M0 conductive pattern M051, then to the V0 via V053, then to the M1 conductive pattern M153. The MD contact structure MD52 is over and in electrical contact with corresponding source/drain regions of the transistors TPA1, TPA2, and is not further electrically coupled to other circuit elements. The MD contact structure MD53 is over and in electrical contact with corresponding source/drain regions of the transistors TNA1, TNA2, and is not further electrically coupled to other circuit elements. The MD contact structure MD54 is over and in electrical contact with a corresponding source/drain region of the transistor TPA2, and is further electrically coupled to the VD via VD52, then to the M0 conductive pattern M051, then to the V0 via V053, then to the M1 conductive pattern M153. The MD contact structure MD55 is over and in electrical contact with a corresponding source/drain region of the transistor TNA2, and is not further electrically coupled to other circuit elements. The gate region 510 is the common gate region to the transistors TPA1, TNA1, and is electrically coupled to the VG via VG51, then to the M0 conductive pattern M052, then to the V0 via V051, then to the M1 conductive pattern M151. The gate region 511 is the common gate region to the transistors TPA2, TNA2, and is electrically coupled to the VG via VG52, then to the M0 conductive pattern M053, then to the V0 via V052, then to the M1 conductive pattern M152.

The M1 conductive patterns M151, M152, M153 are IO patterns of the cell 500A and correspond to the inputs A1, A2 and the output ZN described with respect to FIG. 4. The M1 layer is, therefore, the pin access layer of the cell 500A. The IO patterns M151, M152, M153 extend along the U-U' axis and form an acute angle with the gate regions 510, 511, as well as the dummy gate regions 518, 519. The IO patterns M151, M152, M153 are arranged in a boundary 550 having edges 551, 552, 553, 554, 555, 556 connected together to form a closed boundary. The opposing edges 551, 554 extend along the X-X' axis. The other edges 552, 553, 555, 556 extend obliquely to both the X-X' axis and the Y-Y' axis. For example, the opposing edges 553, 556 extend along the U-U' axis, and the opposing edges 552, 555 extend along the V-V' axis. In the example configuration in FIG. 5A, the IO patterns M151, M152, M153 are parallel to each other, and also parallel to the edges 553, 556 of the boundary 550. The IO patterns M151, M152, M153 are arranged at a pitch p in a direction perpendicular to a lengthwise direction of the IO patterns M151, M152, M153, i.e., in a direction perpendicular to the U-U' axis. In the example configuration in FIG. 5A, the IO patterns M151, M153 are spaced from each other by one pitch p. The IO patterns M151, M152 are spaced from each other by two pitches, i.e., 2p, meaning that an additional M1 conductive pattern is placeable between the IO patterns M151, M152. The boundary 550 has a shape of a convex hexagon.

Besides the boundary 550, which is hexagonal, contains the IO patterns and corresponds to the second boundary 250, the cell 500A further comprises a further boundary corresponding to the first boundary 220. The further boundary, also referred to as the first boundary of the cell 500A, is rectangular, and has two opposing edges defined by the dummy gate regions 518, 519, and two further opposing edges coinciding with the edges 551, 554 of the boundary 550. For simplicity, the first, rectangular boundary of the cell 500A is omitted in FIG. 5A. The first boundary contains therein various layers and features of the cell 500A on the front side of a substrate up to, but not including, the pin access layer (i.e., the M1 layer).

The cell 500A has a height along the Y-Y' axis corresponding to one cell height h. Similar to the cell 200, the cell 500A includes, in one or more embodiments, no more than three rows of M0 conductive patterns over the one cell height h. In the example configuration in FIG. 5A, the cell 500A includes two rows of M0 conductive patterns, the first row containing the M0 conductive pattern M051, and the second row containing the M0 conductive patterns M052, M053. In at least one embodiment, one or more advantages described herein are achievable in an IC device corresponding to the cell 500A.

In FIG. 5B, the cell 500B is similar to the cell 500A with respect to the first boundary and the layers and features in the first boundary, at and below the M0 layer. The cell 500B is different from the cell 500A in the configuration of a second boundary and at least one of the IO patterns. The cell 500B has a second boundary 560 with edges 561-566. The second boundary 560 contains therein the IO patterns M151, M152, M154. Unlike the boundary 550 which has a shape of a convex hexagon, the second boundary 560 has a shape of a concave hexagon. Specifically, an internal angle at a corner 567 between the edges 565, 566 of the boundary 560 is greater than 180 degrees, whereas internal angles at the other five corners of the boundary 560 are smaller than 180 degrees. Due to the different shape of the boundary 560, the IO pattern corresponding to the output ZN, i.e., an M1 conductive pattern M154 is shorter than the corresponding M1 conductive pattern M153 in the cell 500A. Further, a location of a V0 via V054 coupled to the M1 conductive pattern M154 is different from that of the corresponding V0 via V053 in the cell 500A. In at least one embodiment, one or more advantages described herein are achievable in an IC device corresponding to the cell 500B.

In FIG. 5C, the cell 500C is similar to the cells 500A, 500B with respect to the first boundary and the layers and features in the first boundary, at and below the M0 layer. The cell 500C is different from the cells 500A, 500B in the configuration of a second boundary and at least one of the IO patterns. The cell 500C has a second boundary 570 with edges 571-576. The second boundary 560 contains therein the IO patterns M151, M154, M155. Unlike the boundary 550 which has a shape of a convex hexagon, the second boundary 570 has a shape of a concave hexagon. Unlike the boundary 560 which has a shape of a concave hexagon with one internal corner greater than 180 degrees, the second boundary 570 has a shape of a concave hexagon with two internal corners greater than 180 degrees. Specifically, an internal angle at a corner 577 between the edges 575, 576 of the boundary 560 is greater than 180 degrees, and an internal angle at a corner 578 between the edges 572, 573 of the boundary 560 is also greater than 180 degrees. Internal angles at the other four corners of the boundary 570 are smaller than 180 degrees. Due to the different shape of the boundary 570, the IO pattern corresponding to the input A2, i.e., an M1 conductive pattern M155 is shorter than the corresponding M1 conductive pattern M152 in the cells 500A, 500B. In at least one embodiment, one or more advantages described herein are achievable in an IC device corresponding to the cell 500C.

Figure 6A:
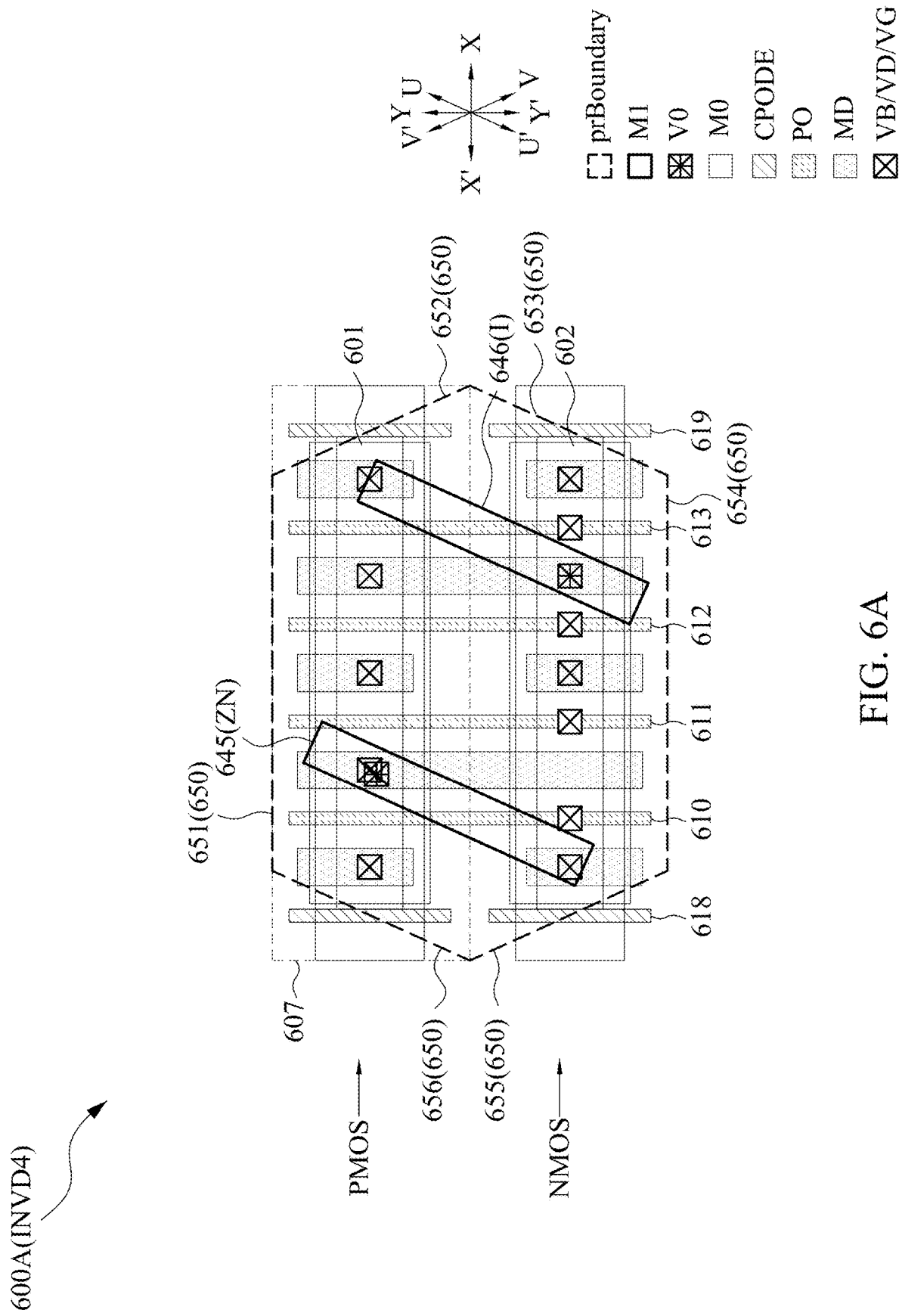
FIGS. 6A-6C are schematic views of various layout diagrams of a cell, in accordance with some embodiments.
Figure 6B:
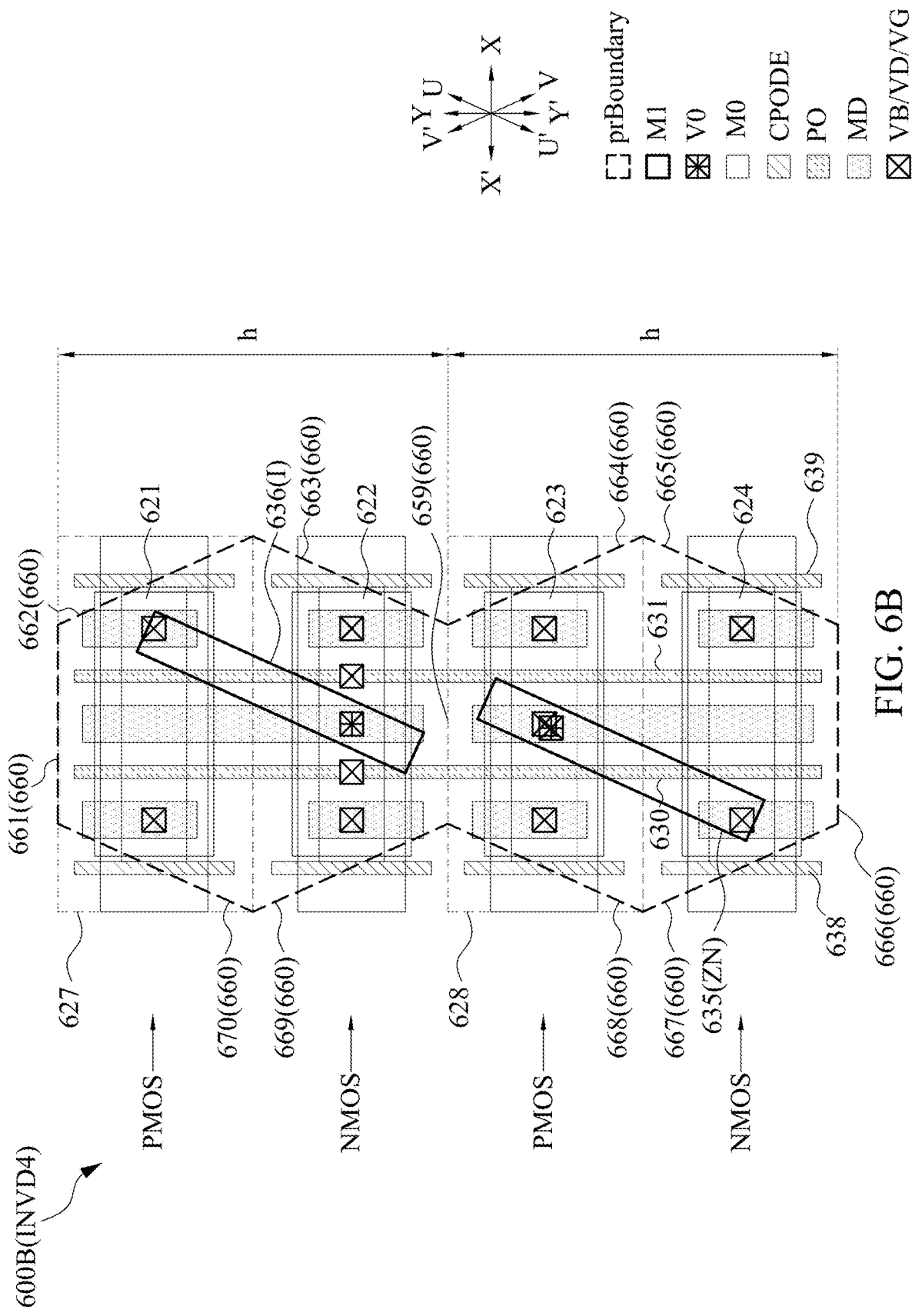
Figure 6C:
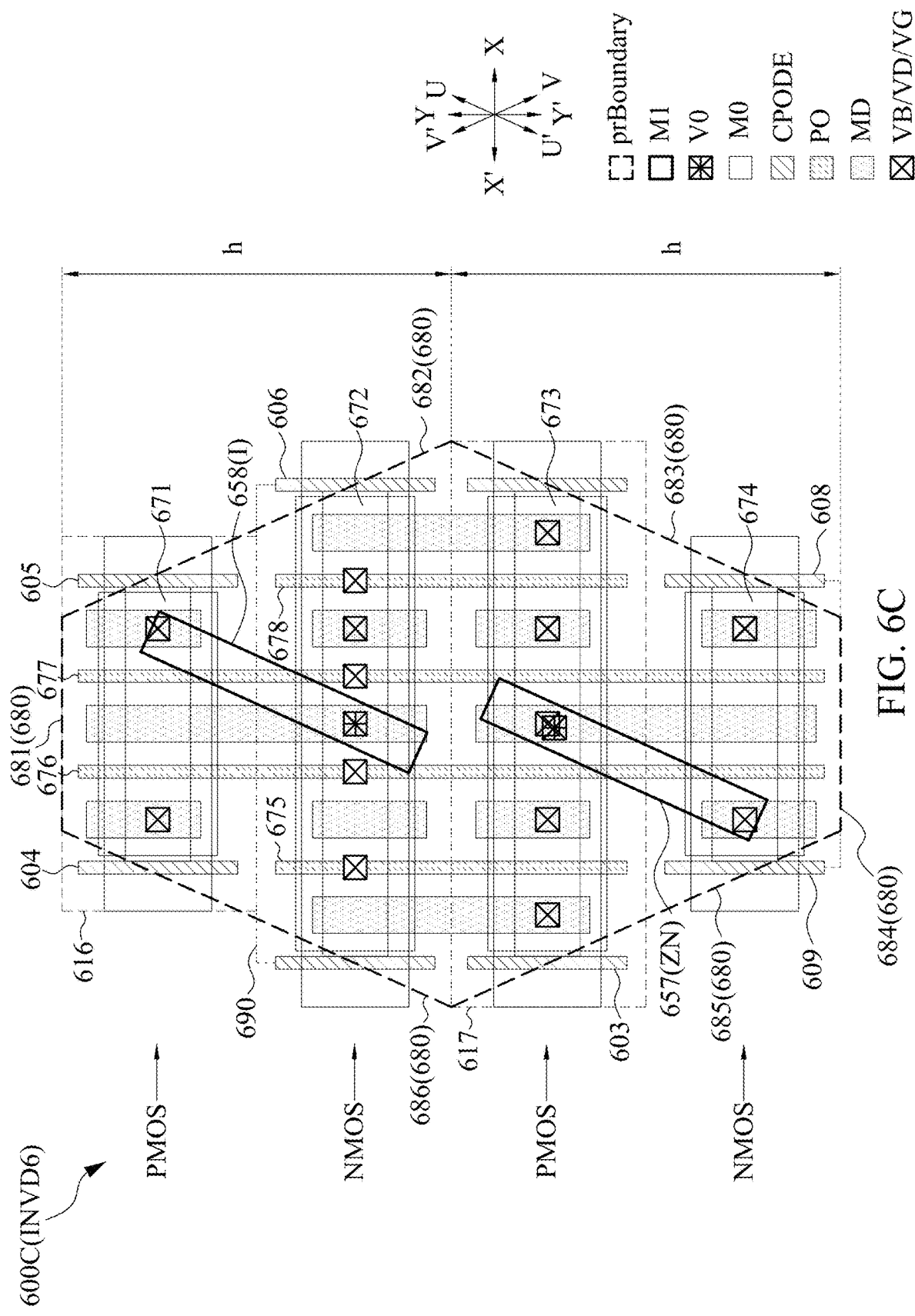

FIGS. 6A-6C are schematic views of layout diagrams of corresponding cells 600A, 600B, 600C, in accordance with some embodiments. In at least one embodiment, the layout diagrams of one or more of the cells 600A-600C are stored as standard cells in a standard cell library on a non-transitory computer-readable medium. The cells 600A-600C are inverters corresponding to the cell 100.

In FIG. 6A, the cell 600A is an inverter with a driving strength of 4, also referred to as "INVD4."

The cell 600A comprises active regions 601, 602 extending along the X-X' axis. The active region 601 is over an N well 607. Unlike the cell 200 with one functional gate region 210 over the active regions 201, 202, the cell 600A comprises four functional gate regions 610-613 over the active regions 601, 602. All four PMOS transistors configured by the four functional gate regions 610-613 and the active region 601 have corresponding gate regions electrically coupled together, corresponding source regions coupled together, and corresponding drain regions coupled together. As a result, all four PMOS transistors are coupled to function as one PMOS transistor corresponding to the transistor PM in FIG. 1, but with a drive strength of 4. Similarly, all four NMOS transistors configured by the four functional gate regions 610-613 and the active region 602 have corresponding gate regions electrically coupled together, corresponding source regions coupled together, and corresponding drain regions coupled together. As a result, all four NMOS transistors are coupled to function as one NMOS transistor corresponding to the transistor NM in FIG. 1, but with a drive strength of 4. The PMOS and NMOS transistors of the cell 600A are electrically coupled together by various MD contact structures, VG vias, VD vias, M0 conductive patterns, V0 vias and M1 conductive patterns in a manner similar to the cell 200 described with respect to FIGS. 2A-2D. The PMOS and NMOS transistors of the cell 600A are further electrically coupled to back side VDD and VSS power rails by various VB through vias in a manner similar to the cell 200 described with respect to FIGS. 2A-2D.

The cell 600A comprises an M1 conductive pattern 645 corresponding to the M1 conductive pattern 245 of the cell 200, and corresponding to the output ZN of the inverter. The cell 600A further comprises an M1 conductive pattern 646 corresponding to the M1 conductive pattern 246 of the cell 200, and corresponding to the input I of the inverter. The M1 conductive patterns 645, 646 are IO patterns of the cell 600A. The M1 layer is, therefore, the pin access layer of the cell 600A. The IO patterns 645, 646 extend along the U-U' axis and form an acute angle with the gate regions 610-613, as well as the dummy gate regions 618, 619. The IO patterns 645, 646 are arranged in a boundary 650 having edges 651, 652, 653, 654, 655, 656 connected together to form a closed boundary. The opposing edges 651, 654 extend along the X-X' axis. The other edges 652, 653, 655, 656 extend obliquely to both the X-X' axis and the Y-Y' axis. For example, the opposing edges 653, 656 extend along the U-U' axis, and the opposing edges 652, 655 extend along the V-V' axis. In the example configuration in FIG. 6A, the IO patterns 645, 646 are parallel to each other, and also parallel to the edges 653, 656 of the boundary 650. The boundary 650 has a shape of a convex hexagon. In some embodiments, the boundary 650 has a shape of a concave hexagon as described with respect to FIG. 5B or FIG. 5C.

Besides the boundary 650, which is hexagonal, contains the IO patterns and corresponds to the second boundary 250, the cell 600A further comprises a further boundary corresponding to the first boundary 220. The further boundary, also referred to as the first boundary of the cell 600A, is rectangular, and has two opposing edges defined by the dummy gate regions 618, 619, and two further opposing edges coinciding with the edges 651, 654 of the boundary 650. For simplicity, the first, rectangular boundary of the cell 600A is omitted in FIG. 6A. The first boundary contains therein various layers and features of the cell 600A on the front side of a substrate up to, but not including, the pin access layer (i.e., the M1 layer).

The cell 600A has a height along the Y-Y' axis corresponding to one cell height h. Similar to the cell 200, the cell 600A includes, in one or more embodiments, no more than three rows of M0 conductive patterns over the one cell height h. In the example configuration in FIG. 6A, the cell 600A includes two rows of M0 conductive patterns. In at least one embodiment, one or more advantages described herein are achievable in an IC device corresponding to the cell 600A.

In FIG. 6B, the cell 600B is an inverter with a driving strength of 4, i.e., the cell 600B is an INVD4 cell. A difference between the INVD4 cells 600A and 600B is that the cell 600B has a double cell height, i.e., 2h, whereas the cell 600A has a single cell height h.

The cell 600B comprises active regions 621-624 extending along the X-X' axis. The active region 621 is over an N well 627, and the active region 623 is over an N well 628. The cell 600B comprises two functional gate regions 630, 631 over the active regions 621-624. All four PMOS transistors configured by the two functional gate regions 630, 631 and the two active regions 621, 623 have corresponding gate regions electrically coupled together, corresponding source regions coupled together, and corresponding drain regions coupled together. As a result, all four PMOS transistors are coupled to function as one PMOS transistor corresponding to the transistor PM in FIG. 1, but with a drive strength of 4. Similarly, all four NMOS transistors configured by the two functional gate regions 630, 631 and the two active region 622, 624 have corresponding gate regions electrically coupled together, corresponding source regions coupled together, and corresponding drain regions coupled together. As a result, all four NMOS transistors are coupled to function as one NMOS transistor corresponding to the transistor NM in FIG. 1, but with a drive strength of 4. The PMOS and NMOS transistors of the cell 600B are electrically coupled together by various MD contact structures, VG vias, VD vias, M0 conductive patterns, V0 vias and M1 conductive patterns in a manner similar to the cell 200 described with respect to FIGS. 2A-2D. The PMOS and NMOS transistors of the cell 600B are further electrically coupled to back side VDD and VSS power rails by various VB through vias in a manner similar to the cell 200 described with respect to FIGS. 2A-2D.

The cell 600B comprises an M1 conductive pattern 635 corresponding to the M1 conductive pattern 245 of the cell 200, and corresponding to the output ZN of the inverter. The cell 600B further comprises an M1 conductive pattern 636 corresponding to the M1 conductive pattern 246 of the cell 200, and corresponding to the input I of the inverter. The M1 conductive patterns 635, 636 are IO patterns of the cell 600B. The M1 layer is, therefore, the pin access layer of the cell 600B. The IO patterns 635, 636 extend along the U-U' axis and form an acute angle with the gate regions 630, 631, as well as the dummy gate regions 638, 639. The IO patterns 635, 636 are arranged in a boundary 660 having edges 661-670 connected together to form a closed boundary. The edges 661, 666 extend along the X-X' axis. The other edges 662-665 and 667-670 extend obliquely to both the X-X' axis and the Y-Y' axis. For example, the edges 663, 665, 668, 670 extend along the U-U' axis, and the edges 662, 664, 667, 669 extend along the V-V' axis. In the example configuration in FIG. 6B, the IO patterns 635, 636 are parallel to each other, and also parallel to the edges 663, 665, 668, 670 of the boundary 660.

The boundary 660 has a shape being a combination of two hexagons. For example, the first hexagon is defined by the edges 661, 662, 663, a line 659, and the edges 669, 670. The second hexagon is defined by the line 659, and the edges 664, 665, 666, 667, 668. In the example configuration in FIG. 6B, both the first and second hexagons are convex hexagons. In some embodiments, at least one of the first and second hexagons is a concave hexagon as described with respect to FIG. 5B or FIG. 5C. Further, the arrangement of the first and second hexagons in FIG. 6B as being stacked or combined along the Y-Y' axis is an example. In at least one embodiment, the first and second hexagons in a cell are stacked or combined along the X-X' axis. In at least one embodiment, more than two hexagons are combined in a cell.

Besides the boundary 660, which contains the IO patterns and corresponds to the second boundary 250, the cell 600B further comprises a further boundary corresponding to the first boundary 220. The further boundary, also referred to as the first boundary of the cell 600B, is rectangular, and has two opposing edges defined by the dummy gate regions 638, 639, and two further opposing edges coinciding with the edges 661, 666 of the boundary 660. For simplicity, the first, rectangular boundary of the cell 600B is omitted in FIG. 6B. The first boundary contains therein various layers and features of the cell 600B on the front side of a substrate up to, but not including, the pin access layer (i.e., the M1 layer).

The cell 600B includes four active regions 621-624 arranged consecutively along the Y-Y' axis, and has a height along the Y-Y' axis corresponding to 2h. Similar to the cell 200, the cell 600B includes, in one or more embodiments, no more than three rows of M0 conductive patterns over each cell height h. In the example configuration in FIG. 6B, the cell 600B includes four rows of M0 conductive patterns. In some embodiments, a maximum number of rows of M0 conductive patterns in the cell 600B is six. In at least one embodiment, one or more advantages described herein are achievable in an IC device corresponding to the cell 600B.

In FIG. 6C, the cell 600C is an inverter with a driving strength of 6, also referred to as "INVD6." The cell 600C also has a double cell height, i.e., 2h.

The cell 600C comprises active regions 671-674 extending along the X-X' axis. The active region 671 is over an N well 616, and the active region 673 is over an N well 617. The cell 600C comprises four functional gate regions 675-678 over the active regions 671-674. Two functional gate regions 676, 677 and the active region 671 configure two PMOS transistors, and the four functional gate regions 675-678 and the active region 673 configure four further PMOS transistors. All six PMOS transistors have corresponding gate regions electrically coupled together, corresponding source regions coupled together, and corresponding drain regions coupled together. As a result, all six PMOS transistors are coupled to function as one PMOS transistor corresponding to the transistor PM in FIG. 1, but with a drive strength of 6. Similarly, all six NMOS transistors configured by the functional gate regions 675-678 and the two active region 672, 674 have corresponding gate regions electrically coupled together, corresponding source regions coupled together, and corresponding drain regions coupled together. As a result, all six NMOS transistors are coupled to function as one NMOS transistor corresponding to the transistor NM in FIG. 1, but with a drive strength of 6. The PMOS and NMOS transistors of the cell 600C are electrically coupled together by various MD contact structures, VG vias, VD vias, M0 conductive patterns, V0 vias and M1 conductive patterns in a manner similar to the cell 200 described with respect to FIGS. 2A-2D. The PMOS and NMOS transistors of the cell 600C are further electrically coupled to back side VDD and VSS power rails by various VB through vias in a manner similar to the cell 200 described with respect to FIGS. 2A-2D.

The cell 600C comprises an M1 conductive pattern 657 corresponding to the M1 conductive pattern 245 of the cell 200, and corresponding to the output ZN of the inverter. The cell 600C further comprises an M1 conductive pattern 658 corresponding to the M1 conductive pattern 246 of the cell 200, and corresponding to the input I of the inverter. The M1 conductive patterns 657, 658 are IO patterns of the cell 600C. The M1 layer is, therefore, the pin access layer of the cell 600C. The IO patterns 657, 658 extend along the U-U' axis and form an acute angle with the gate regions 675-678, as well as the dummy gate regions 603-606 and 608-609. The IO patterns 657, 658 are arranged in a boundary 680 having edges 681-686 connected together to form a closed, hexagonal boundary. The edges 681, 684 extend along the X-X' axis. The other edges extend obliquely to both the X-X' axis and the Y-Y' axis. For example, the edges 683, 686 extend along the U-U' axis, and the edges 682, 685 extend along the V-V' axis. In the example configuration in FIG. 6C, the IO patterns 657, 658 are parallel to each other, and also parallel to the edges 683, 686 of the boundary 680. In some embodiments, the boundary 680 has a shape of a concave hexagon as described with respect to FIG. 5B or FIG. 5C.

Besides the boundary 680, which contains the IO patterns and corresponds to the second boundary 250, the cell 600C further comprises a further boundary corresponding to the first boundary 220. The further boundary, also referred to as the first boundary 690 of the cell 600C, has a shape being a combination of three rectangles.

Figures 6D, 7:
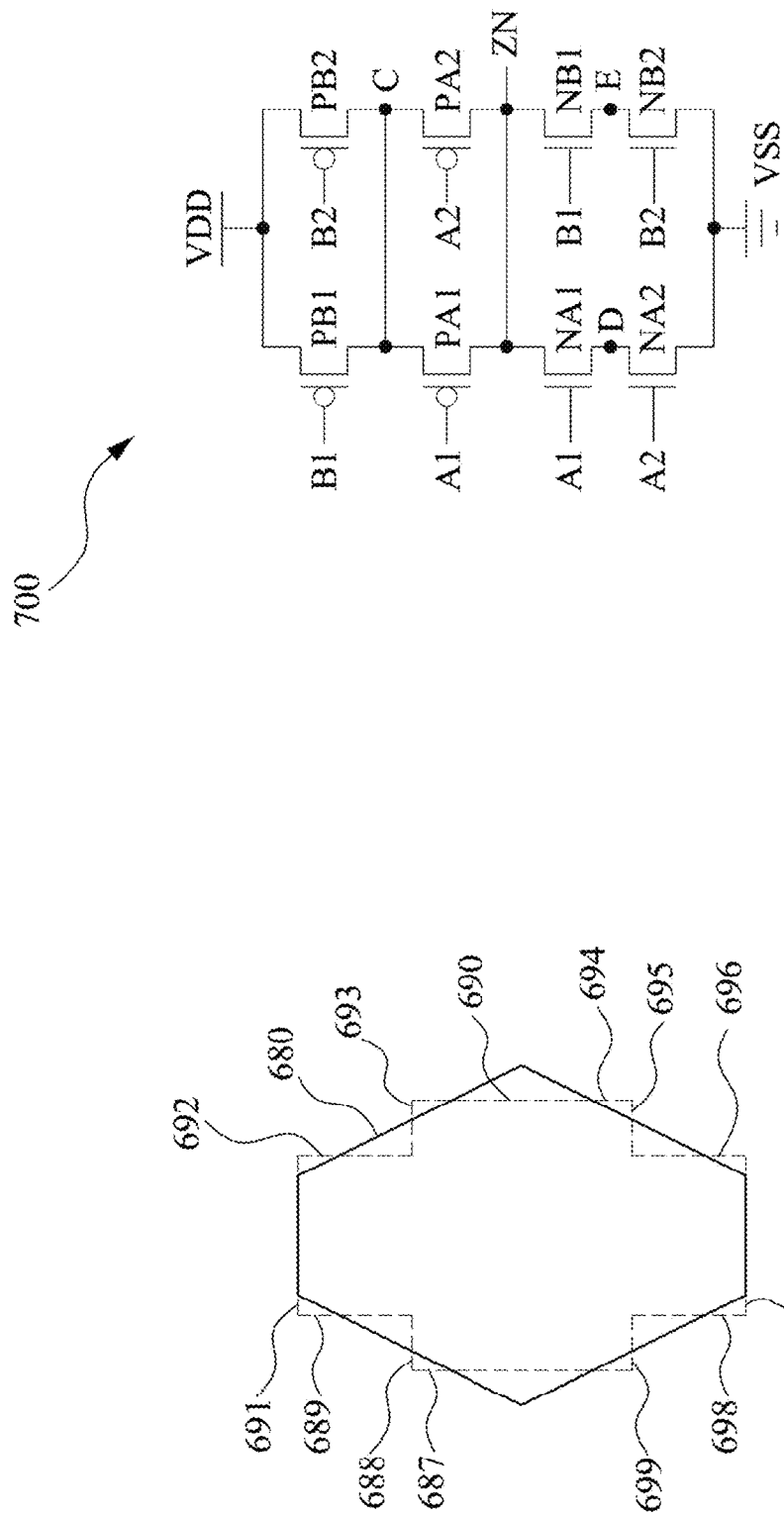
FIG. 6D is a schematic view showing cell boundaries of a cell, in accordance with some embodiments.
FIG. 7 is a circuit diagram of a cell, in accordance with some embodiments.

FIG. 6D which is a schematic view showing the boundaries 680, 690 of the cell 600C. The first boundary 690 of the cell 600C includes edges 687-689 and 691-699 connected together to form a closed boundary. The edges 687, 689, 692, 694, 696, 698 in FIG. 6D correspond to dummy gate regions 603-606 and 608-609 in FIG. 6C. The edges 688, 693 in FIG. 6D correspond to a lower edge of the N well 616 in FIG. 6C. The edge 691 in FIG. 6D coincides with the edge 681 in FIG. 6C. The edges 695, 699 in FIG. 6D correspond to a lower edge of the N well 617 in FIG. 6C. The edge 697 in FIG. 6D coincides with the edge 684 in FIG. 6C. The first boundary 690 contains therein various layers and features of the cell 600C on the front side of a substrate up to, but not including, the pin access layer (i.e., the M1 layer).

The cell 600C includes four active regions 671-674 arranged consecutively along the Y-Y' axis, and has a height along the Y-Y' axis corresponding to 2h. Similar to the cell 200, the cell 600C includes, in one or more embodiments, no more than three rows of M0 conductive patterns over each cell height h. In the example configuration in FIG. 6C, the cell 600C includes four rows of M0 conductive patterns. In some embodiments, a maximum number of rows of M0 conductive patterns in the cell 600C is six. In at least one embodiment, one or more advantages described herein are achievable in an IC device corresponding to the cell 600C.

FIG. 7 is a schematic circuit diagram of a cell 700 of an IC device, in accordance with some embodiments. In the example configuration in FIG. 7, the cell 700 comprises an AND-OR-Invert (AOI) logic with two 2-input AND gates corresponding to a standard cell sometimes referred to as an AOI22D1 cell.

The cell 700 comprises inputs A1, A2, B1, B2, an output ZN, and a plurality of transistors PA1, PA2, PB1, PB2, NA1, NA2, NB1, NB2 electrically coupled together to perform, in operation, a predetermined function of the cell 700. In the example configuration in FIG. 7, the cell 700 comprises PMOS transistors PA1, PA2, PB1, PB2 and NMOS transistors NA1, NA2, NB1, NB2. Gates of the transistors PA1, NA1 are electrically coupled to the input A1. Gates of the transistors PA2, NA2 are electrically coupled to the input A2. Gates of the transistors PB1, NB1 are electrically coupled to the input B1. Gates of the transistors PB2, NB2 are electrically coupled to the input B2. Sources of the transistors PB1, PB2 are electrically coupled to VDD. Drains of the transistors PB1, PB2 are electrically coupled to a node C. As a result, the transistors PB1, PB2 are electrically coupled in parallel between VDD and the node C. Sources of the transistors PA1, PA2 are electrically coupled to the node C. Drains of the transistors PA1, PA2 are electrically coupled to the output ZN. As a result, the transistors PA1, PA2 are electrically coupled in parallel between the node C and the output ZN. The parallel coupled transistors PB1, PB2 and the parallel coupled transistors PA1, PA2 are electrically coupled in series at the node C. Sources of the transistors NA2, NB2 are electrically coupled to VSS. A drain of the transistor NA2 is electrically coupled to a source of the transistor NA1 at a node D. As a result, the transistors NA1, NA2 are electrically coupled in series. A drain of the transistor NB2 is electrically coupled to a source of the transistor NB1 at a node E. As a result, the transistors NB1, NB2 are electrically coupled in series. Drains of the transistors NA1, NB1 are electrically coupled to the output ZN. As a result, the serially coupled transistors NA1, NA2 and the serially coupled transistors NB1, NB2 are coupled in parallel between the output ZN and VSS.

Figure 8A:
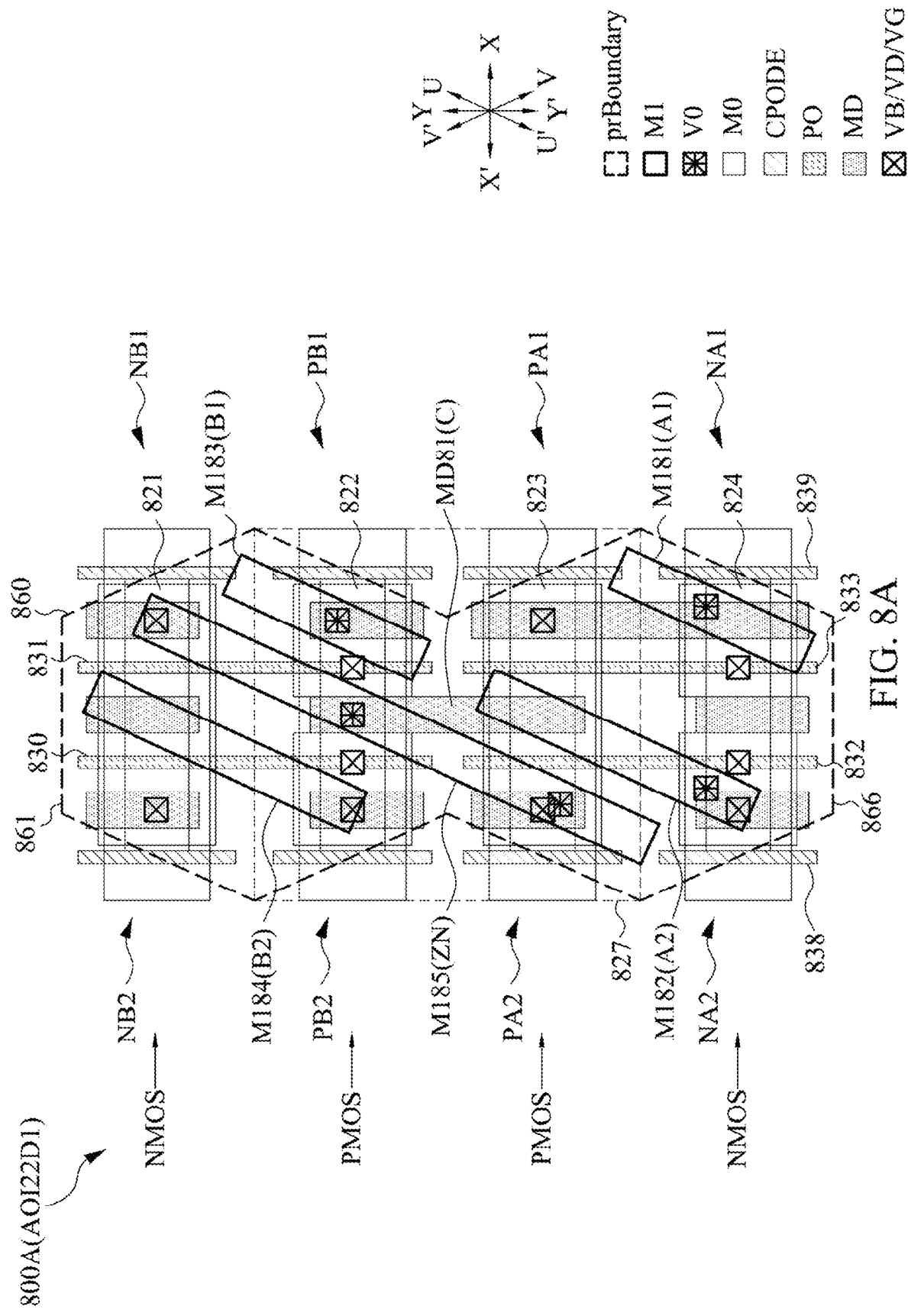
FIGS. 8A-8B are schematic views of various layout diagrams of a cell, in accordance with some embodiments.
Figure 8B:
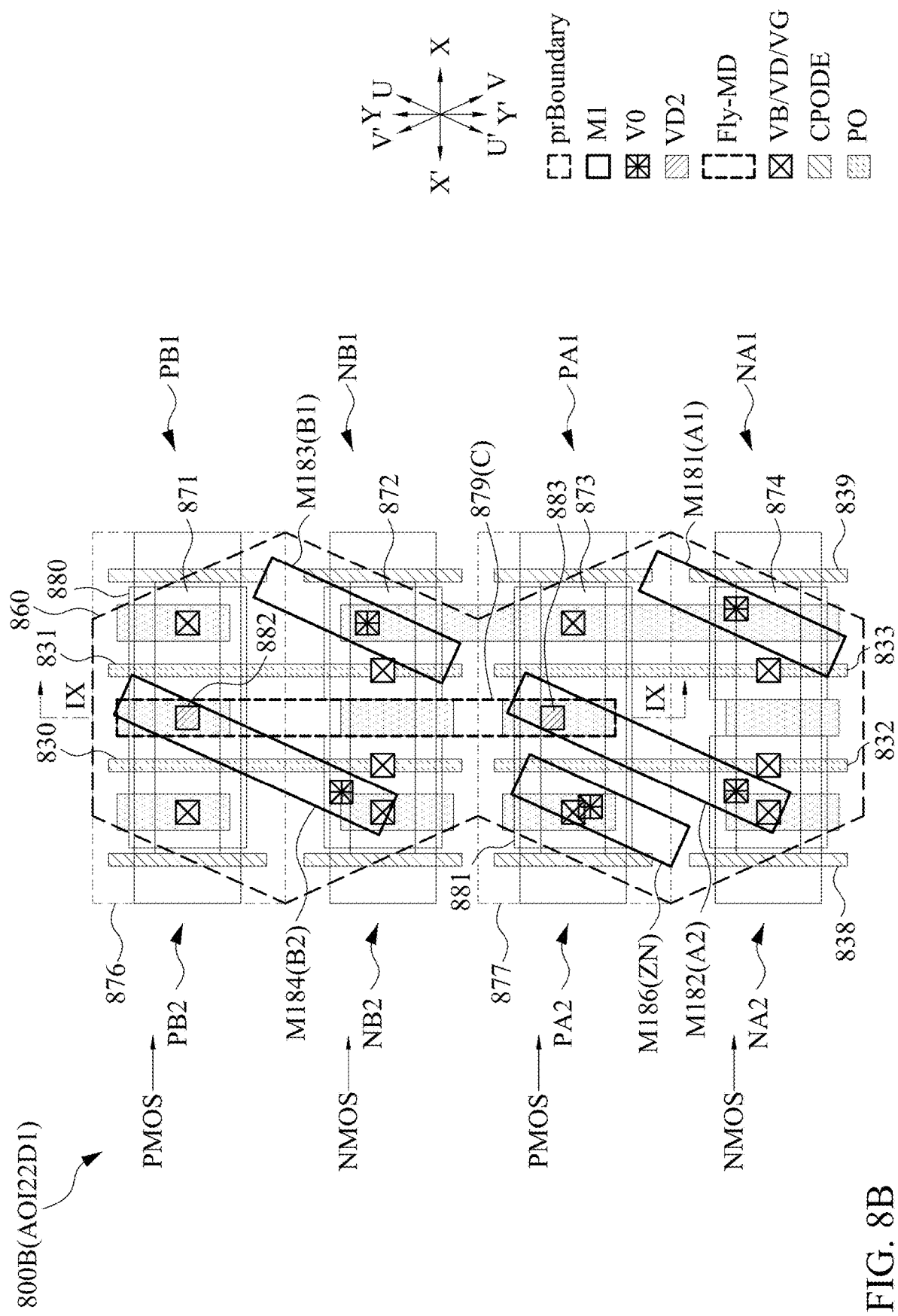

FIGS. 8A-8B are schematic views of layout diagrams of corresponding cells 800A, 800B in accordance with some embodiments. In at least one embodiment, the layout diagrams of one or more of the cells 800A, 800B are stored as standard cells in a standard cell library on a non-transitory computer-readable medium. The cells 800A, 800B are AOI22D1 cells corresponding to the cell 700. In the example configuration in FIGS. 8A-8B, the cells 800A, 800B have a driving strength of 1. Other cells with different driving strengths are within the scopes of various embodiments.

In FIG. 8A, the cell 800A comprises active regions 821-824 extending along the X-X' axis. The active regions 822, 823 are directly adjacent to each other and are over an N well 827. The cell 800A comprises functional gate regions 830, 831, 832, 833 over the active regions 821-824. The gate regions 830, 832 are aligned along the Y-Y' axis and are electrically isolated from each other. The gate regions 831, 833 are aligned along the Y-Y' axis and are electrically isolated from each other. The gate regions 830, 831 configure, together with the active region 821, transistors NB2, NB1 as described with respect to FIG. 7. The functional gate regions 830, 831 configure, together with the active region 822, transistors PB2, PB1 as described with respect to FIG. 7. The gate regions 832, 833 configure, together with the active region 823, transistors PA2, PA1 as described with respect to FIG. 7. The functional gate regions 832, 833 configure, together with the active region 824, transistors NA2, NA1 as described with respect to FIG. 7. The PMOS and NMOS transistors of the cell 800A are electrically coupled together by various MD contact structures, VG vias, VD vias, M0 conductive patterns, V0 vias and M1 conductive patterns to realize the circuitry described with respect to FIG. 7. For example, an elongated MD contact structure MD81 extends across two active regions 822, 823, electrically couples the corresponding source/drain regions of the transistors PB2, PB1, PA2, PA1, and corresponds to node C in FIG. 7. The PMOS and NMOS transistors of the cell 800A are further electrically coupled to back side VDD and VSS power rails by various VB through vias to realize the circuitry described with respect to FIG. 7.

The cell 800A comprises M1 conductive patterns M181-M185 corresponding to the inputs A1, A2, B1, B2 and the output ZN described with respect to FIG. 7. The M1 conductive patterns M181-M185 are IO patterns of the cell 800A. The M1 layer is, therefore, the pin access layer of the cell 800A. The IO patterns M181-M185 extend along the U-U' axis and form an acute angle with the gate regions 830-833, as well as the dummy gate regions 838, 839. The IO patterns M181-M185 are arranged in a boundary 860 which has a shape being a combination of two hexagons similar to the boundary 660 described with respect to FIG. 6B.

Besides the boundary 860, which contains the IO patterns and corresponds to the second boundary 250, the cell 800A further comprises a further boundary corresponding to the first boundary 220. The further boundary, also referred to as the first boundary of the cell 800A, is rectangular, and has two opposing edges defined by the dummy gate regions 838, 839, and two further opposing edges coinciding with the uppermost and lowermost edges 861, 866 of the boundary 860. For simplicity, the first, rectangular boundary of the cell 800A is omitted in FIG. 8A. The first boundary contains therein various layers and features of the cell 800A on the front side of a substrate up to, but not including, the pin access layer (i.e., the M1 layer).

The cell 800A includes four active regions 821-824 arranged consecutively along the Y-Y' axis, and has a height along the Y-Y' axis corresponding to 2h. Similar to the cell 200, the cell 800A includes, in one or more embodiments, no more than three rows of M0 conductive patterns over each cell height h. In the example configuration in FIG. 8A, the cell 800A includes four rows of M0 conductive patterns. In some embodiments, a maximum number of rows of M0 conductive patterns in the cell 800A is six. In at least one embodiment, one or more advantages described herein are achievable in an IC device corresponding to the cell 800A.

In FIG. 8B, the cell 800B includes a different layout diagram for an AOI22D1 cell. A difference between the cell 800A and the cell 800B is the arrangement of PMOS and NMOS active regions along the Y-Y' axis. In FIG. 8A, the active regions are arranged in the following order PMOS, PMOS, NMOS, NMOS, whereas FIG. 8B, the active regions are arranged in the following order PMOS, NMOS, PMOS, NMOS. A further difference involves a structure for realizing the node C in FIG. 7.

The cell 800B comprises active regions 871-874 extending along the X-X' axis. The active regions 871 is over an N well 876, and the active region 873 is over an N well 877. The cell 800B comprises functional gate regions 830, 831, 832, 833 over the active regions 871-874. The gate regions 830, 832 are aligned along the Y-Y' axis and are electrically isolated from each other. The gate regions 831, 833 are aligned along the Y-Y' axis and are electrically isolated from each other. The gate regions 830, 831 configure, together with the active region 871, transistors PB2, PB1 as described with respect to FIG. 7. The functional gate regions 830, 831 configure, together with the active region 872, transistors NB2, NB1 as described with respect to FIG. 7. The gate regions 832, 833 configure, together with the active region 873, transistors PA2, PA1 as described with respect to FIG. 7. The functional gate regions 832, 833 configure, together with the active region 874, transistors NA2, NA1 as described with respect to FIG. 7. The PMOS and NMOS transistors of the cell 800B are electrically coupled together by various MD contact structures, VG vias, VD vias, M0 conductive patterns, V0 vias and M1 conductive patterns to realize the circuitry described with respect to FIG. 7. The PMOS and NMOS transistors of the cell 800B are further electrically coupled to back side VDD and VSS power rails by various VB through vias to realize the circuitry described with respect to FIG. 7.

To realize node C in FIG. 7, the cell 800B comprises, instead of the elongated MD contact structure MD81 as in FIG. 8A, an extended contact structure 879 which electrically couples the corresponding source/drain regions of the transistors PB2, PB1, PA2, PA1. The extended contact structure 879 is schematically illustrated in the drawings with the label "Fly-MD," and is referred to herein as "Fly-MD structure." Opposite ends of the Fly-MD structure 879 are electrically coupled to corresponding MD contact structures in the active regions 871, 873, by corresponding VD2 vias 880, 881. A middle portion of the Fly-MD structure 879 extends over, or "flies" over, a underlying MD contact structure in the active region 872, without being electrically coupled to the underlying MD contact structure in the active region 872. In some embodiments, Fly-MD structures belong to a mask different from a mask for MD contact structures. An example structure for the Fly-MD structure 879 is described with respect to FIG. 9.

The cell 800B comprises M1 conductive patterns M181-M184, M186 corresponding to the inputs A1, A2, B1, B2 and the output ZN described with respect to FIG. 7. The M1 conductive patterns M181-M184, M186 are IO patterns of the cell 800B and are arranged in a boundary 860 having the same shape as described with respect to FIG. 8A. Besides the boundary 860, which contains the IO patterns and corresponds to the second boundary 250, the cell 800B further comprises a further boundary corresponding to the first boundary 220. The further boundary, also referred to as the first boundary of the cell 800B, is rectangular, and has the same shape as described with respect to FIG. 8A. For simplicity, the first, rectangular boundary of the cell 800B is omitted in FIG. 8B. The first boundary contains therein various layers and features of the cell 800B on the front side of a substrate up to, but not including, the pin access layer (i.e., the M1 layer).

The cell 800B includes four active regions 871-874 arranged consecutively along the Y-Y' axis, and has a height along the Y-Y' axis corresponding to 2h. Similar to the cell 200, the cell 800B includes, in one or more embodiments, no more than three rows of M0 conductive patterns over each cell height h. In the example configuration in FIG. 8B, the cell 800B includes four rows of M0 conductive patterns. In some embodiments, a maximum number of rows of M0 conductive patterns in the cell 800B is six. In at least one embodiment, one or more advantages described herein are achievable in an IC device corresponding to the cell 800B.

Figure 9:
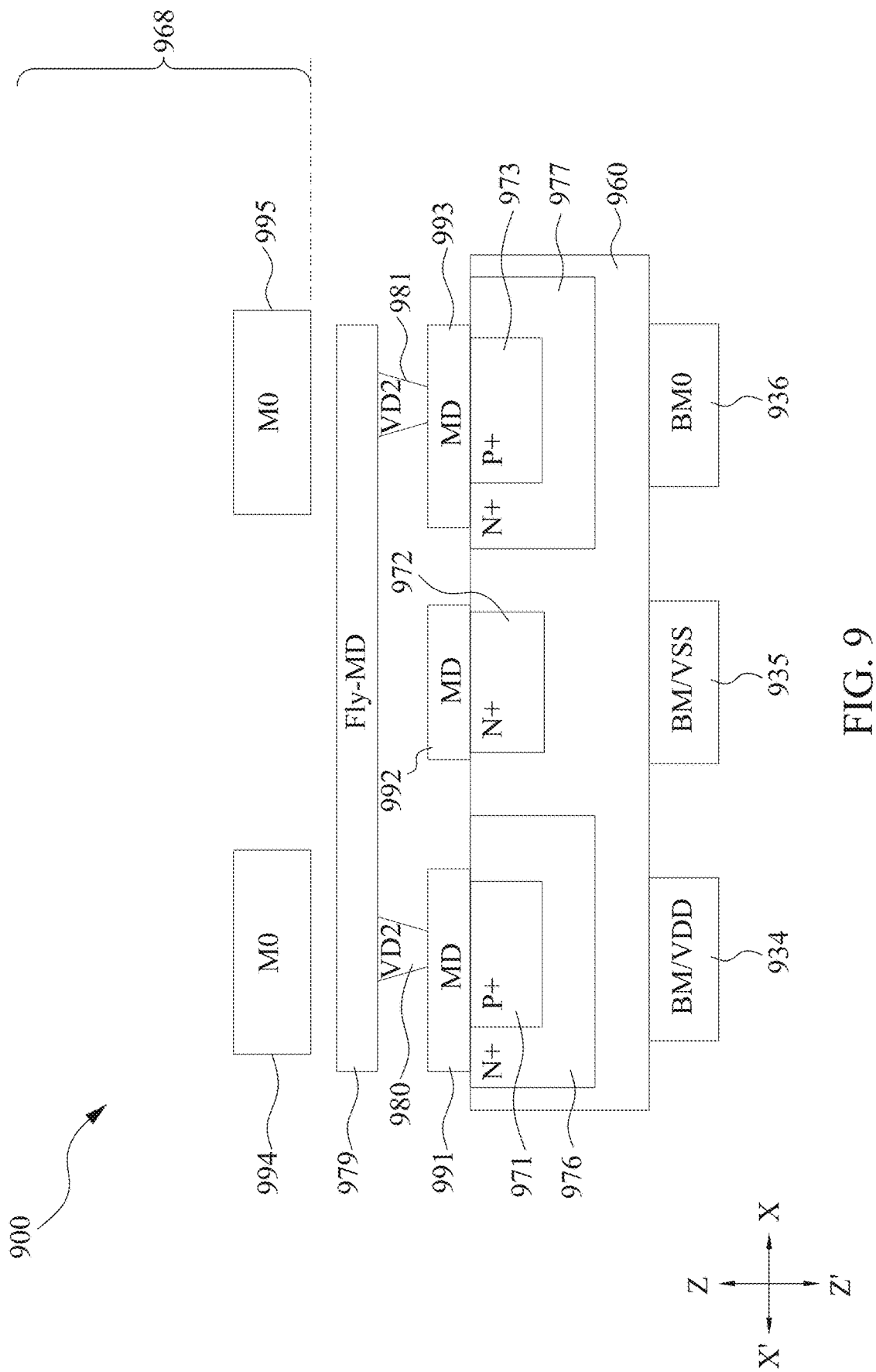
FIG. 9 is a schematic cross-sectional view, taken along line IX-IX in FIG. 8B, of an IC device, in accordance with some embodiments.

FIG. 9 is a schematic cross-sectional view, taken along lines IX-IX in FIG. 8B, of an IC device 900, in accordance with some embodiments. The IC device 900 comprises, in FIG. 9, an AOI22D1 logic corresponding to the cell 800B described with respect to FIG. 8B. Components in FIG. 9 having corresponding components in FIG. 8B are designated by the reference numerals of FIG. 8B increased by 100. Components in FIG. 9 having corresponding components in FIG. 3 are designated by the reference numerals of FIG. 3 increased by 600.

As shown in FIG. 9, the IC device 900 comprises a substrate 960 over which circuit elements and structures corresponding to the cell 800B are formed. The IC device 900 comprises, under the substrate 960, BM conductive patterns 934, 935, 936 configured to, e.g., provide power supply voltages to circuit elements on the front side of the substrate 960. For example, the BM conductive pattern 934 is a VDD power rail, and the BM conductive pattern 935 is a VSS power rail. The IC device 900 comprises, over the substrate 960, N wells 976, 977 corresponding to the N wells 876, 877 in FIG. 8B. The IC device 900 further comprises P well 971, N well 972, P well 973 corresponding to source/drain regions in the active regions 871, 872, 873 in FIG. 8B. MD contact structures 991, 992, 993 are over and in electrical contact with the corresponding source/drain regions 971, 972, 973. The IC device 900 comprises a Fly-MD structure 979 corresponding to the Fly-MD structure 879 in FIG. 8B. Opposite ends of the Fly-MD structure 979 are electrically coupled to the corresponding MD contact structures 991, 993 over the active regions 971, 973, by corresponding VD2 vias 980, 981. The VD2 vias 980, 981 correspond to the VD2 vias 880, 881 in FIG. 8B. A middle portion of the Fly-MD structure 979 extends over, or "flies" over, without being electrically coupled to, the MD contact structure 992 over the active region 972. The IC device 900 further comprises an interconnect structure 968 with various metal layers and via layers. Example M0 conductive patterns 994, 995 in the interconnect structure 968 are illustrated in FIG. 9. In at least one embodiment, one or more advantages described herein are achievable in the IC device 900.

Figure 10A:
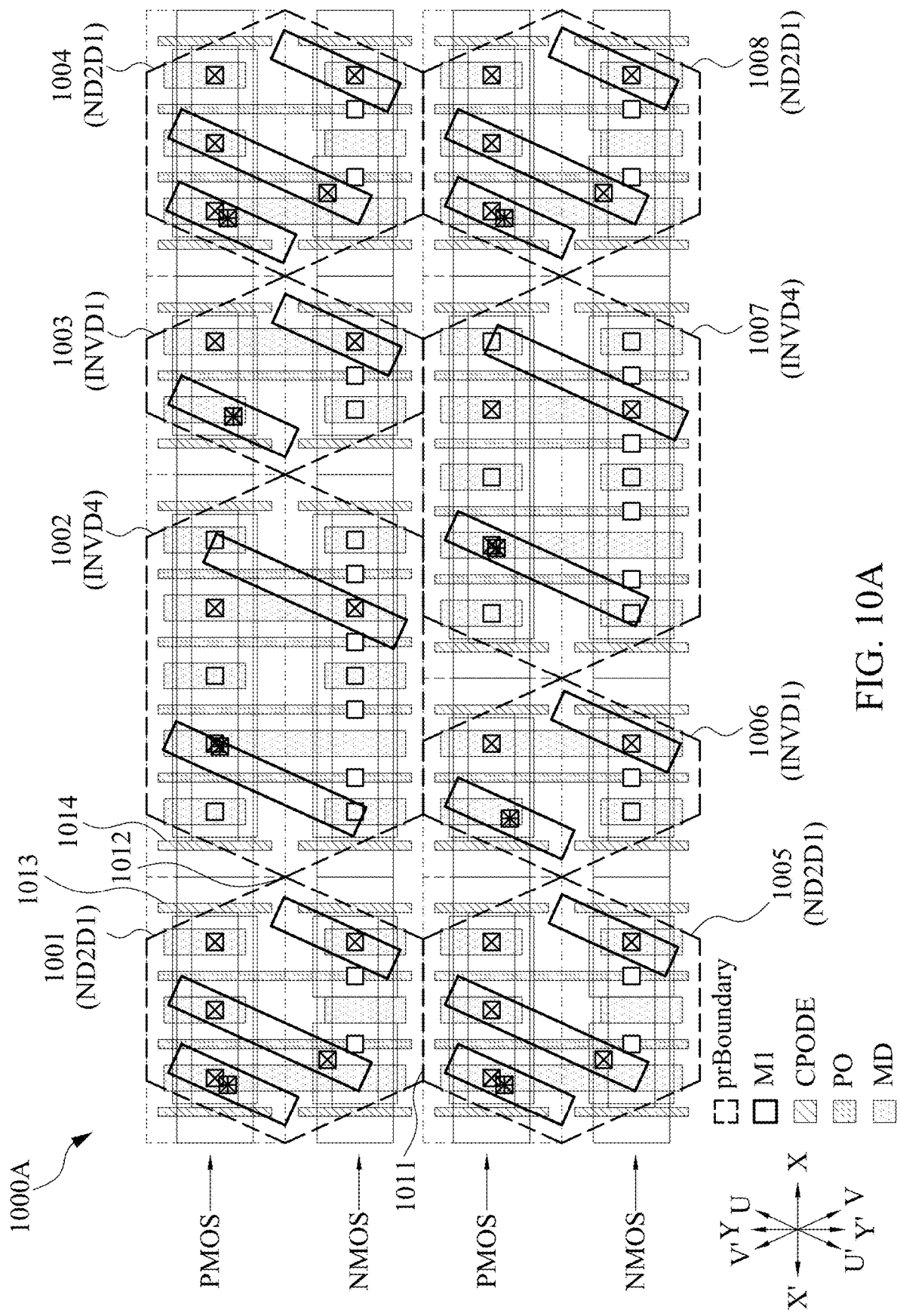
FIGS. 10A-10E are each a schematic cross-sectional view of an IC layout diagram of an IC device including layout diagrams of various cells constituting the IC layout diagram of the IC device, in accordance with some embodiments.

FIG. 10A is a schematic cross-sectional view of an IC layout diagram of an IC device 1000A including layout diagrams of various cells constituting the IC layout diagram of the IC device 1000A, in accordance with some embodiments.

The IC device 1000A comprises cells 1001-1008. The cells 1001, 1004, 1005, 1008 are ND2D1 cells corresponding to the cell 500A described with respect to FIG. 5A. The cells 1002, 1007 are INVD4 cells corresponding to the cell 600A described with respect to FIG. 6A. The cells 1003, 1006 are INVD1 cells corresponding to the cell 200 described with respect to FIGS. 2A-2D. For simplicity, the first boundaries containing layers and features under the pin access layer of the cells are omitted, and the second boundaries containing 10 patterns in the pin access layer of the cells are shown.

Along the Y-Y' axis, one of the cells 1001-1008 is placed in abutment with another of the cells 1001-1008, at a common edge extending along the X-X' axis. For example, the cell 1001 is placed in abutment with the cell 1005 at a common edge 1011 extending along the X-X' axis. In this abutment, the first, rectangular boundaries of the cells 1001, 1005 abut each other at the common edge 1011. At the same time, the second, hexagonal boundaries of the cells 1001, 1005 also abut each other at the common edge 1011.

Along the X-X' axis, one of the cells 1001-1008 is placed in abutment with another of the cells 1001-1008, at a corner of the corresponding second boundaries of the cells. For example, the second, hexagonal boundaries of the cells 1001, 1002 abut each other at a corner 1012. The first rectangular boundaries of the cells 1001, 1002 are spaced from each other. For example, an edge 1013 of the first rectangular boundary of the cell 1001 is separated along the X-X' axis from an adjacent edge 1014 of the first rectangular boundary of the cell 1002 by an empty space. In at least one embodiment, this empty space is unfilled. In one or more embodiments, this empty space is filled by an appropriate filler cell as described herein. In at least one embodiment, one or more advantages described herein are achievable in the IC device 1000A.

Figure 10B:
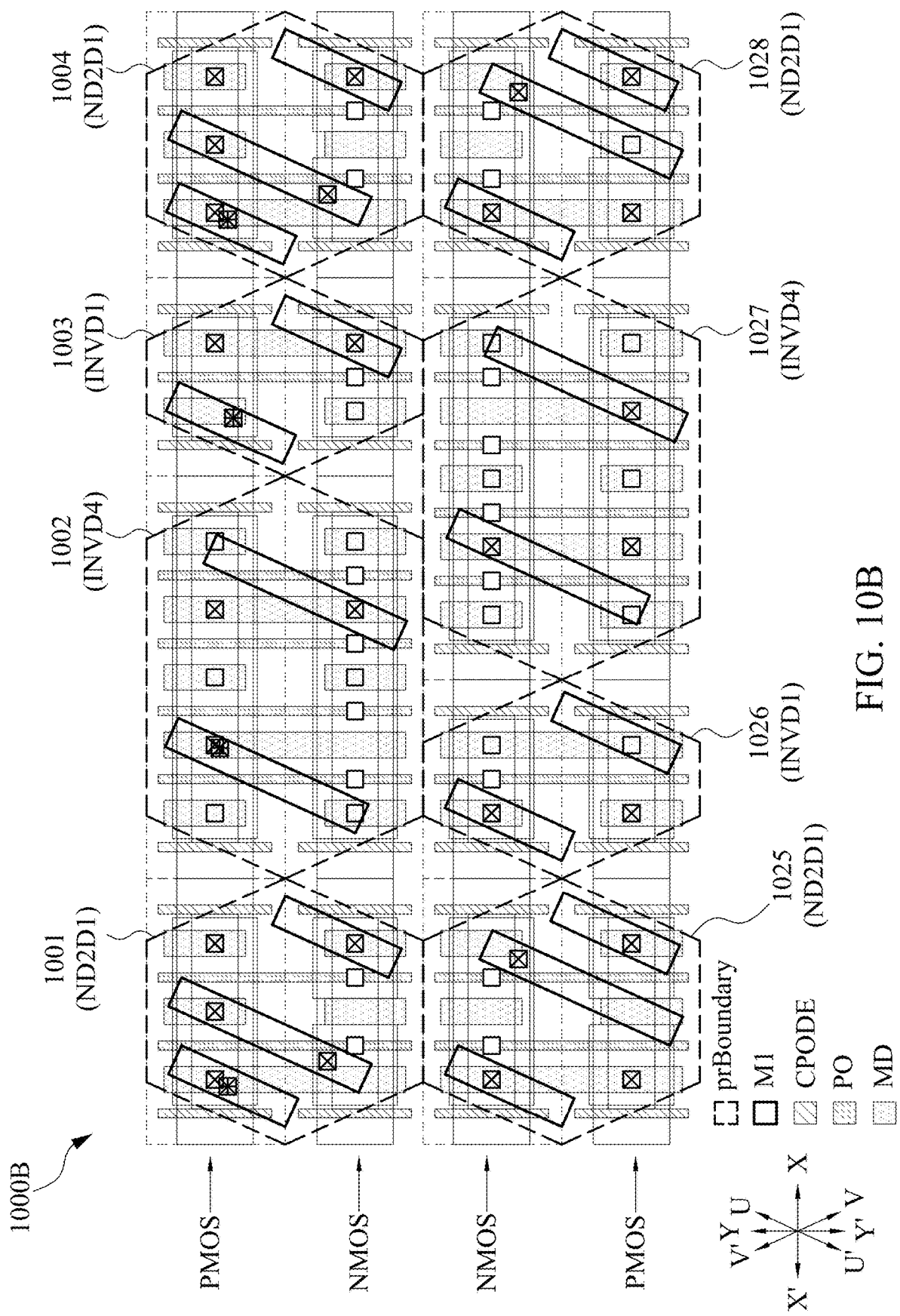

FIG. 10B is a schematic cross-sectional view of an IC layout diagram of an IC device 1000B including layout diagrams of various cells constituting the IC layout diagram of the IC device 1000B, in accordance with some embodiments. A difference between the IC device 1000A and the IC device 1000B is the arrangement of PMOS and NMOS active regions along the Y-Y' axis. In FIG. 10A, the active regions are arranged in the following order PMOS, NMOS, PMOS, NMOS, whereas FIG. 10B, the active regions are arranged in the following order PMOS, PMOS, NMOS, NMOS.

The IC device 1000B comprises the cells 1001-1004 as in the IC device 1000A. The IC device 1000B further comprises cells 1025-1028. The cells 1025, 1028 are ND2D1 cells corresponding to the cell 500A described with respect to FIG. 5A, but with the PMOS and NMOS active regions switch place. The cell 1026 is an INVD1 corresponding to the cell 200 described with respect to FIGS. 2A-2D, but with the PMOS and NMOS active regions switch place. The cell 1027 is an INVD4 cell corresponding to the cell 600A described with respect to FIG. 6A, but with the PMOS and NMOS active regions switch place. The cells in the IC device 1000B are placed in abutment in the same manner as described with respect to FIG. 10A. In at least one embodiment, one or more advantages described herein are achievable in the IC device 1000B.

Figure 10C:
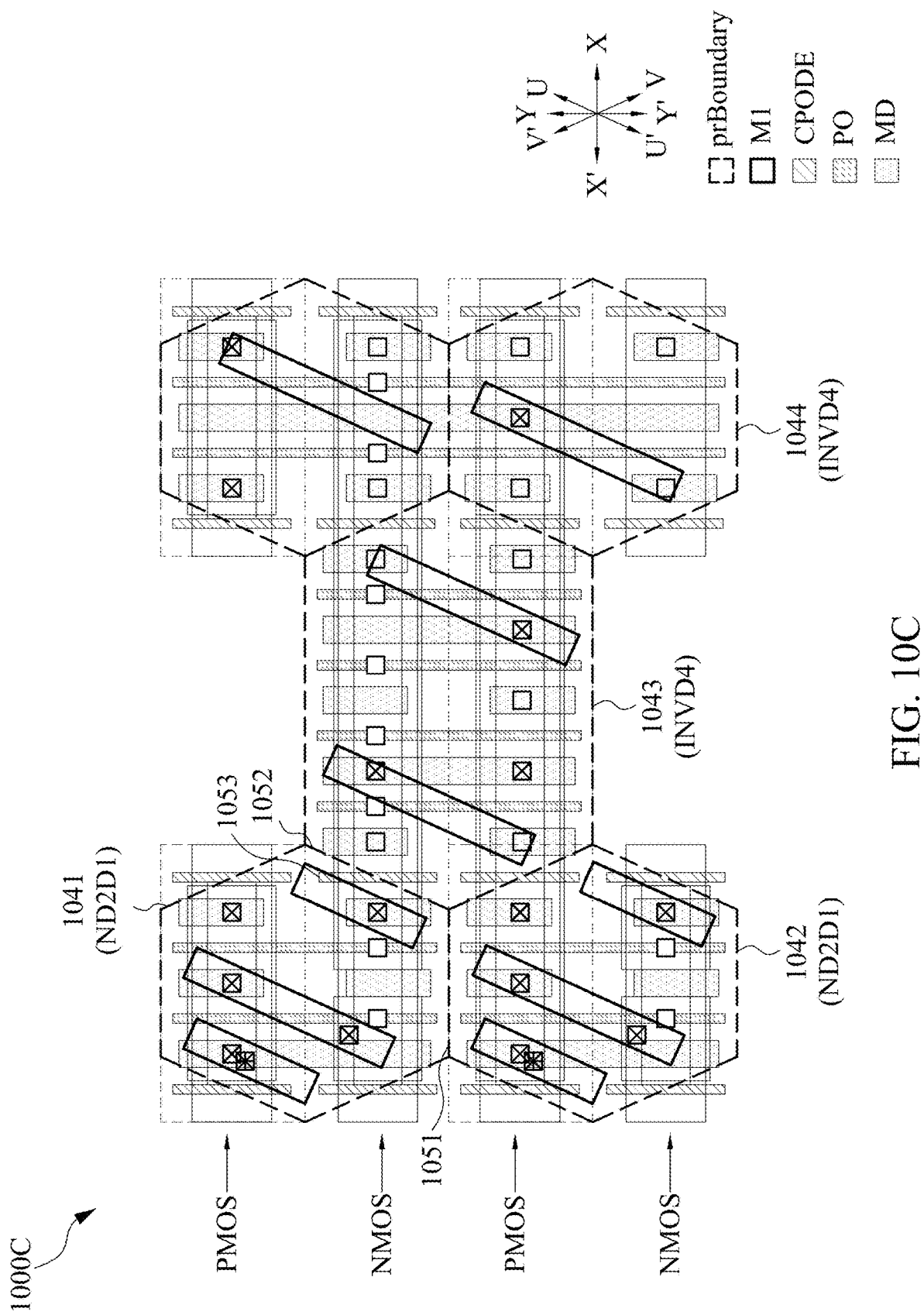

FIG. 10C is a schematic cross-sectional view of an IC layout diagram of an IC device 1000C including layout diagrams of various cells constituting the IC layout diagram of the IC device 1000C, in accordance with some embodiments. A difference between the IC device 1000C and the IC devices 1000A, 1000B is that cell abutment along the X-X' axis in the IC device 1000C occur at common edges, rather than at corners.

The IC device 1000C comprises cells 1041-1044. The cells 1041, 1042 are ND2D1 cells corresponding to the cell 500A described with respect to FIG. 5A. The cell 1043 is an INVD4 cell corresponding to the cell 600A described with respect to FIG. 6A, but with the PMOS and NMOS active regions switch place. The cells 1044 is an INVD4 cell with a double cell height and corresponding to the cell 600B described with respect to FIG. 6B. For simplicity, the first boundaries containing layers and features under the pin access layer of the cells are omitted, and the second boundaries containing 10 patterns in the pin access layer of the cells are shown.

Along the Y-Y' axis, one of the cells 1041-1044 is placed in abutment with another of the cells 1041-1044, at a common edge extending along the X-X' axis. For example, the cell 1041 is placed in abutment with the cell 1042 at a common edge 1051 extending along the X-X' axis, as described with respect to FIG. 10A.

Along the X-X' axis, one of the cells 1041-1044 is placed in abutment with another of the cells 1041-1044, at one or more common edges for both the first boundary and the second boundary. For example, the second, hexagonal boundaries of the cells 1041, 1043 abut each other at a common edge 1052 oblique to both the X-X' axis and the Y-Y' axis. At the same time, the first rectangular boundaries of the cells 1041, 1042 abut each other at a common edge 1053. In at least one embodiment, one or more advantages described herein are achievable in the IC device 1000C.

Figure 10D:
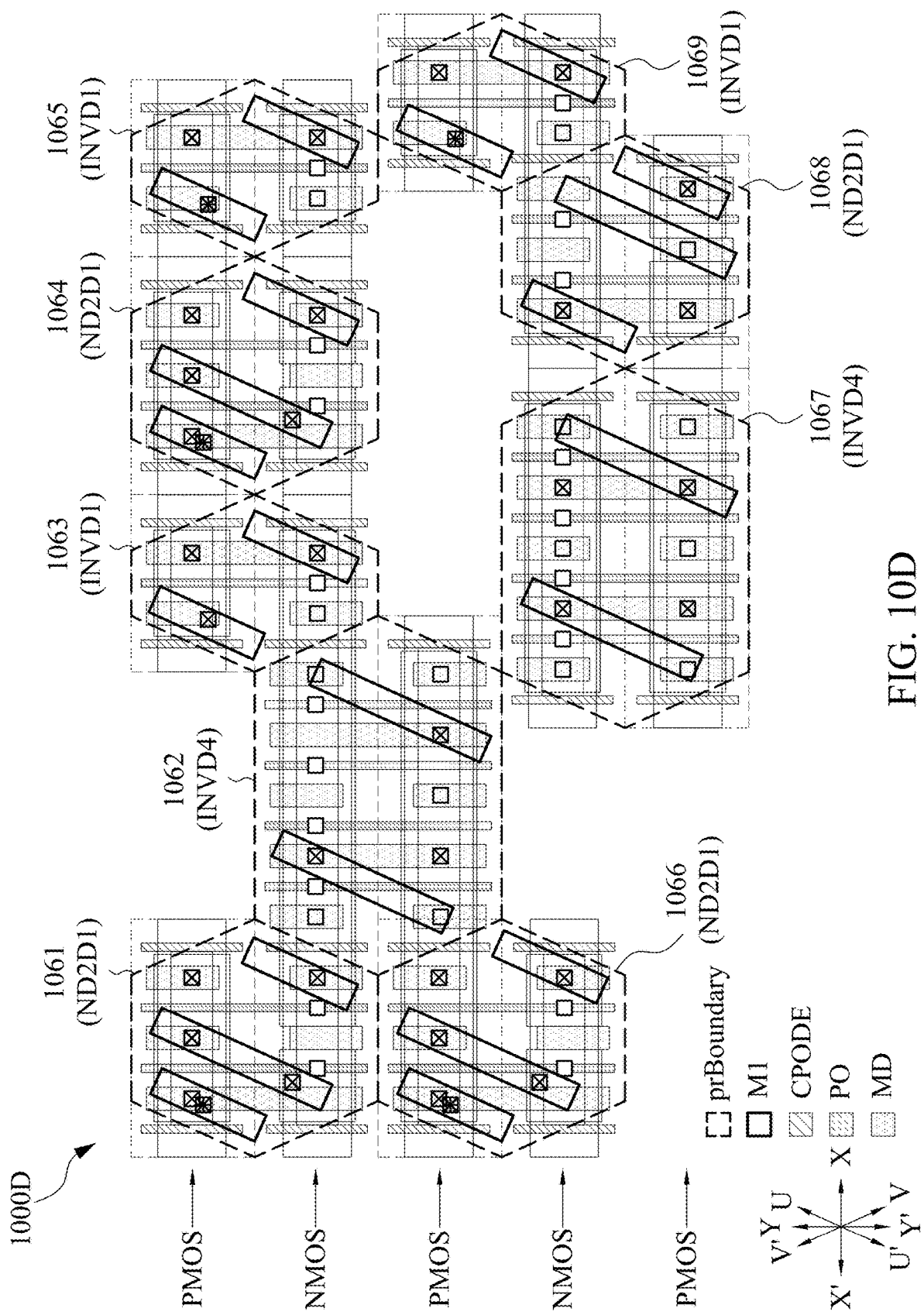

FIG. 10D is a schematic cross-sectional view of an IC layout diagram of an IC device 1000D including layout diagrams of various cells constituting the IC layout diagram of the IC device 1000D, in accordance with some embodiments. In the IC device 1000D, cell abutments along the X-X' axis are performed in a mixed approach, using both cell abutments at common edges as in FIG. 10C, and cell abutments at corners as in FIGS. 10A-10B.

The IC device 1000D comprises cells 1061-1069. The cells 1061, 1064, 1066 are ND2D1 cells corresponding to the cell 500A described with respect to FIG. 5A. The cell 1062 is an INVD4 cell corresponding to the cell 600A described with respect to FIG. 6A, but with the PMOS and NMOS active regions switch place. The cells 1063, 1065, 1069 are INVD1 cells corresponding to the cell 200 described with respect to FIGS. 2A-2D. The cell 1067 is an INVD4 cell corresponding to the cell 600A described with respect to FIG. 6A, but with the PMOS and NMOS active regions switch place. The cell 1068 is an ND2D1 cell corresponding to the cell 500A described with respect to FIG. 5A, but with the PMOS and NMOS active regions switch place. In the IC device 1000D, cell abutments along the X-X' axis are performed in a mixed approach, using both cell abutments at common edges and cell abutments at corners. For example, the cells 1061, 1062 abut each other at common edges as described with respect to the cells 1041, 1043 in FIG. 10C. For another example, the cells 1063, 1064 abut each other at a corner as described with respect to the cells 1001, 1002 in FIG. 10A. In at least one embodiment, one or more advantages described herein are achievable in the IC device 1000D.

Figure 10E:
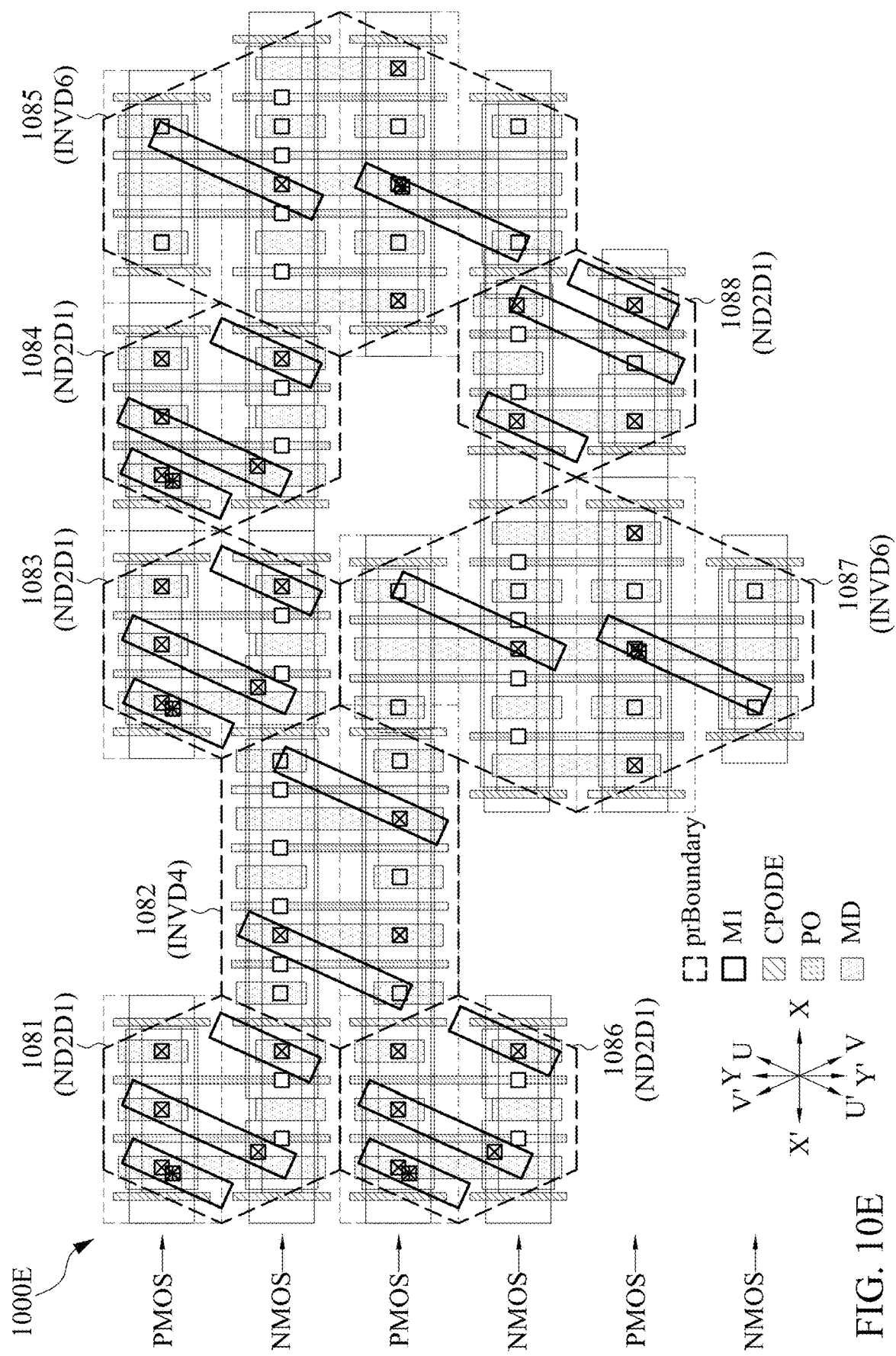

FIG. 10E is a schematic cross-sectional view of an IC layout diagram of an IC device 1000E including layout diagrams of various cells constituting the IC layout diagram of the IC device 1000E, in accordance with some embodiments. The IC device 1000E is a further example in which cell abutments along the X-X' axis are performed in a mixed approach, using both cell abutments at common edges as in FIG. 10C, and cell abutments at corners as in FIGS. 10A-10B.

The IC device 1000E comprises cells 1081-1088. The cells 1081, 1083, 1084, 1086 are ND2D1 cells corresponding to the cell 500A described with respect to FIG. 5A. The cell 1082 is an INVD4 cell corresponding to the cell 600A described with respect to FIG. 6A, but with the PMOS and NMOS active regions switch place. The cells 1085, 1087 are INVD6 cells corresponding to the cell 600C described with respect to FIG. 6C. The cell 1088 is an ND2D1 cell corresponding to the cell 500A described with respect to FIG. 5A, but with the PMOS and NMOS active regions switch place. In the IC device 1000E, cell abutments along the X-X' axis are performed in a mixed approach, using both cell abutments at common edges and cell abutments at corners. For example, the cells 1081, 1082 abut each other at common edges as described with respect to the cells 1041, 1043 in FIG. 10C. For another example, the cells 1083, 1084 abut each other at a corner as described with respect to the cells 1001, 1002 in FIG. 10A. In at least one embodiment, one or more advantages described herein are achievable in the IC device 1000E.

FIGS. 11A-11I are schematic cross-sectional views of layout diagrams of various filler cells, in accordance with some embodiments. As described herein and illustrated in FIGS. 10A-10E, cell abutments in a layout diagram of an IC device create empty spaces which are filled by one or more appropriate filler cells.

In FIG. 11A, a filler cell FILL 1 comprises a portion of a PMOS active region 1101 over an N well 1102, gate regions 1103, 1104, an MD contact structure 1105, a BM conductive pattern 1106, and a boundary 1107. The boundary 1107 has a shape of a triangle with edges oblique to both the X-X' axis and Y-Y' axis. The gate regions 1103, 1104 are dummy gate regions in one or more embodiments. In at least one embodiment, the filler cell FILL 1 comprises an NMOS active region instead of the PMOS active region 1101.

In FIG. 11B, a filler cell FILL 2 comprises a portion of a PMOS active region 1111 over an N well 1112, gate regions 1113, 1114, 1118, MD contact structures 1115, a BM conductive pattern 1116, and a boundary 1117. The boundary 1117 has a shape of an isosceles trapezoid with side edges oblique to both the X-X' axis and Y-Y' axis. The gate regions 1113, 1114 are dummy gate regions in one or more embodiments. In at least one embodiment, the filler cell FILL 2 comprises an NMOS active region instead of the PMOS active region 1111. In at least one embodiment, the filler cell FILL 2 is configured as a decap cell, for example, with the gate region 1118 being a functional gate region.

In FIG. 11C, a filler cell FILL 3 comprises a portion of a PMOS active region 1121 over an N well 1122, gate regions 1123, 1124, 1128, 1129, MD contact structures 1125, a BM conductive pattern 1126, and a boundary 1127. The boundary 1127 has a shape of an isosceles trapezoid with side edges oblique to both the X-X' axis and Y-Y' axis. The gate regions 1123, 1124 are dummy gate regions in one or more embodiments. In at least one embodiment, the filler cell FILL 3 comprises an NMOS active region instead of the PMOS active region 1121. In at least one embodiment, the filler cell FILL 3 is configured as a decap cell, for example, with the gate regions 1128, 1129 being functional gate regions. Other filler cells having similar shapes to the filler cell FILL 3 and more than four gate regions are within the scopes of various embodiments.

In FIG. 11D, a filler cell FILL 4 comprises a portion of an NMOS active region 1131, gate regions 1133, 1134, an MD contact structure 1135, a BM conductive pattern 1136, and a boundary 1137. The boundary 1137 has a shape of a triangle with edges oblique to both the X-X' axis and Y-Y' axis. The gate regions 1133, 1134 are dummy gate regions in one or more embodiments. In at least one embodiment, the filler cell FILL 4 comprises a PMOS active region instead of the NMOS active region 1131.

In FIG. 11E, a filler cell FILL 5 comprises a portion of an NMOS active region 1141, gate regions 1143, 1144, 1148, MD contact structures 1145, a BM conductive pattern 1146, and a boundary 1147. The boundary 1147 has a shape of an isosceles trapezoid with side edges oblique to both the X-X' axis and Y-Y' axis. The gate regions 1143, 1144 are dummy gate regions in one or more embodiments. In at least one embodiment, the filler cell FILL 5 comprises a PMOS active region instead of the NMOS active region 1141. In at least one embodiment, the filler cell FILL 5 is configured as a decap cell, for example, with the gate region 1148 being a functional gate region.

In FIG. 11F, a filler cell FILL 6 comprises a portion of an NMOS active region 1151, gate regions 1153, 1154, 1158, 1159, MD contact structures 1155, a BM conductive pattern 1156, and a boundary 1157. The boundary 1157 has a shape of an isosceles trapezoid with side edges oblique to both the X-X' axis and Y-Y' axis. The gate regions 1153, 1154 are dummy gate regions in one or more embodiments. In at least one embodiment, the filler cell FILL 6 comprises a PMOS active region instead of the NMOS active region 1151. In at least one embodiment, the filler cell FILL 6 is configured as a decap cell, for example, with the gate regions 1158, 1159 being functional gate regions. Other filler cells having similar shapes to the filler cell FILL 6 and more than four gate regions are within the scopes of various embodiments.

Each of the filler cells FILL 1 to FILL 6 has one active region along the Y-Y' axis, and is considered to have a half cell height (h/2). Filler cells with one cell height (h) in accordance with some embodiments are described herein.

In FIG. 11G, a filler cell FILL 7 is obtained by combining a filler cell FILL 1 with a filler cell FILL 4. The filler cell FILL 7 has one cell height (h) and a boundary 1167 which has a shape of a rhombus. In at least one embodiment, the PMOS active region and the NMOS active region in the filler cell FILL 7 switch place.

In FIG. 11H, a filler cell FILL 8 is obtained by combining a filler cell FILL 2 with a filler cell FILL 5. The filler cell FILL 8 has one cell height (h) and a boundary 1177 which has a shape of a hexagon. In at least one embodiment, the PMOS active region and the NMOS active region in the filler cell FILL 8 switch place.

In FIG. 11I, a filler cell FILL 9 is obtained by combining a filler cell FILL 3 with a filler cell FILL 6. The filler cell FILL 9 has one cell height (h) and a boundary 1187 which has a shape of a hexagon. In at least one embodiment, the PMOS active region and the NMOS active region in the filler cell FILL 9 switch place. In at least one embodiment, the filler cell FILL 8 or FILL 9 is configured as a decap cell. Other filler cells having similar shapes to the filler cell FILL 9 and more than four columns of gate regions are within the scopes of various embodiments.

Figure 12:
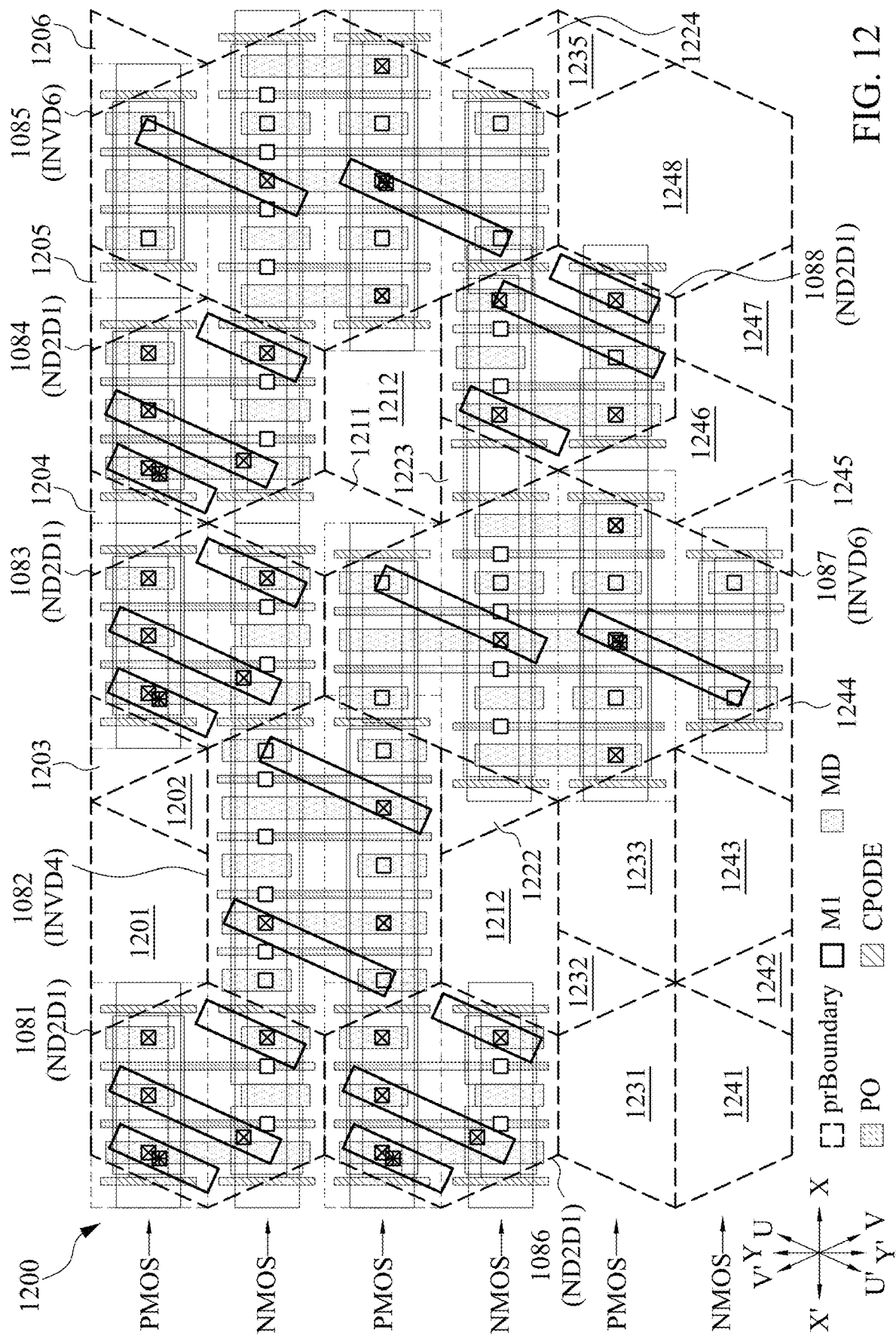
FIG. 12 is a schematic cross-sectional view of an IC layout diagram of an IC device including layout diagrams of various cells constituting the IC layout diagram of the IC device, in accordance with some embodiments.

FIG. 12 is a schematic cross-sectional view of an IC layout diagram of an IC device 1200 including layout diagrams of various cells constituting the IC layout diagram of the IC device 1200, in accordance with some embodiments.

The IC device 1200 comprises the cells 1081-1088 of the IC device 1000E. The IC device 1200 further comprises filler cells 1201-1206, 1211-1212, 1221-1224, 1231-1235, 1241-1248 that fill in the empty spaces between the cells 1081-1088. Each of the filler cells 1201-1206, 1211-1212, 1221-1224, 1231-1235, 1241-1248 is one of the filler cells FILL 1 to FILL 9 described with respect to FIGS. 11A-11I. For example, filler cell 1201 corresponds to filler cell FILL 3. Filler cell 1202 corresponds to filler cell FILL 4 with a PMOS active region. Filler cells 1203-1206 correspond to filler cell FILL 1. Filler cell 1211 corresponds to filler cell FILL 7. Filler cell 1212 corresponds to filler cell FILL 6 with a PMOS active region. Filler cell 1221 corresponds to filler cell FILL 6. Filler cells 1222-1223 correspond to filler cell FILL 1 with an NMOS active region. Filler cell 1224 corresponds to filler cell FILL 4. Filler cells 1231, 1233 correspond to filler cell FILL 6 with a PMOS active region. Filler cells 1232, 1235 correspond to filler cell FILL 1. Filler cell 1234 corresponds to filler cell FILL 4 with a PMOS active region. Filler cells 1241, 1243 correspond to filler cell FILL 3 with an NMOS active region. Filler cells 1242, 1244, 1245 correspond to filler cell FILL 4. Filler cell 1246 corresponds to filler cell FILL 2 with an NMOS active region. Filler cell 1247 corresponds to filler cell FILL 5. Filler cell 1248 corresponds to filler cell FILL 9 with the PMOS active region and the NMOS active region switching place. Each of the filler cells 1201-1206, 1211-1212, 1221-1224, 1231-1235, 1241-1248 are placed in abutment with one or more of the cells 1081-1088, or with another filler cell by cell abutment at common edges as described with respect to FIG. 10C. In at least one embodiment, one or more advantages described herein are achievable in the IC device 1200.

Figure 13A:

FIG. 13A is a flowchart of a method 1300A of generating a layout diagram and using the layout diagram to manufacture an IC device, in accordance with some embodiments.

Method 1300A is implementable, for example, using an EDA system as described herein and/or an integrated circuit (IC) manufacturing system as described herein, in accordance with some embodiments. Regarding method 1300A, examples of the layout diagram include the layout diagrams disclosed herein with respect to one or more of FIGS. 1-12, or the like. Examples of an IC device to be manufactured according to method 1300A include the IC devices disclosed with respect to one or more of FIGS. 1-12.

At block 1305, a layout diagram is generated which, among other things, include patterns represent one or more cells as described with respect to one or more of FIGS. 1-12, or the like. Block 1305 is discussed in more detail below with respect to FIG. 13B.

At block 1315, based on the layout diagram, at least one of (A) one or more photolithographic exposures are made or (b) one or more semiconductor masks are fabricated or (C) one or more components in a layer of an IC device are fabricated. Block 1315 is discussed in more detail below with respect to FIG. 13C.

Figure 13B:
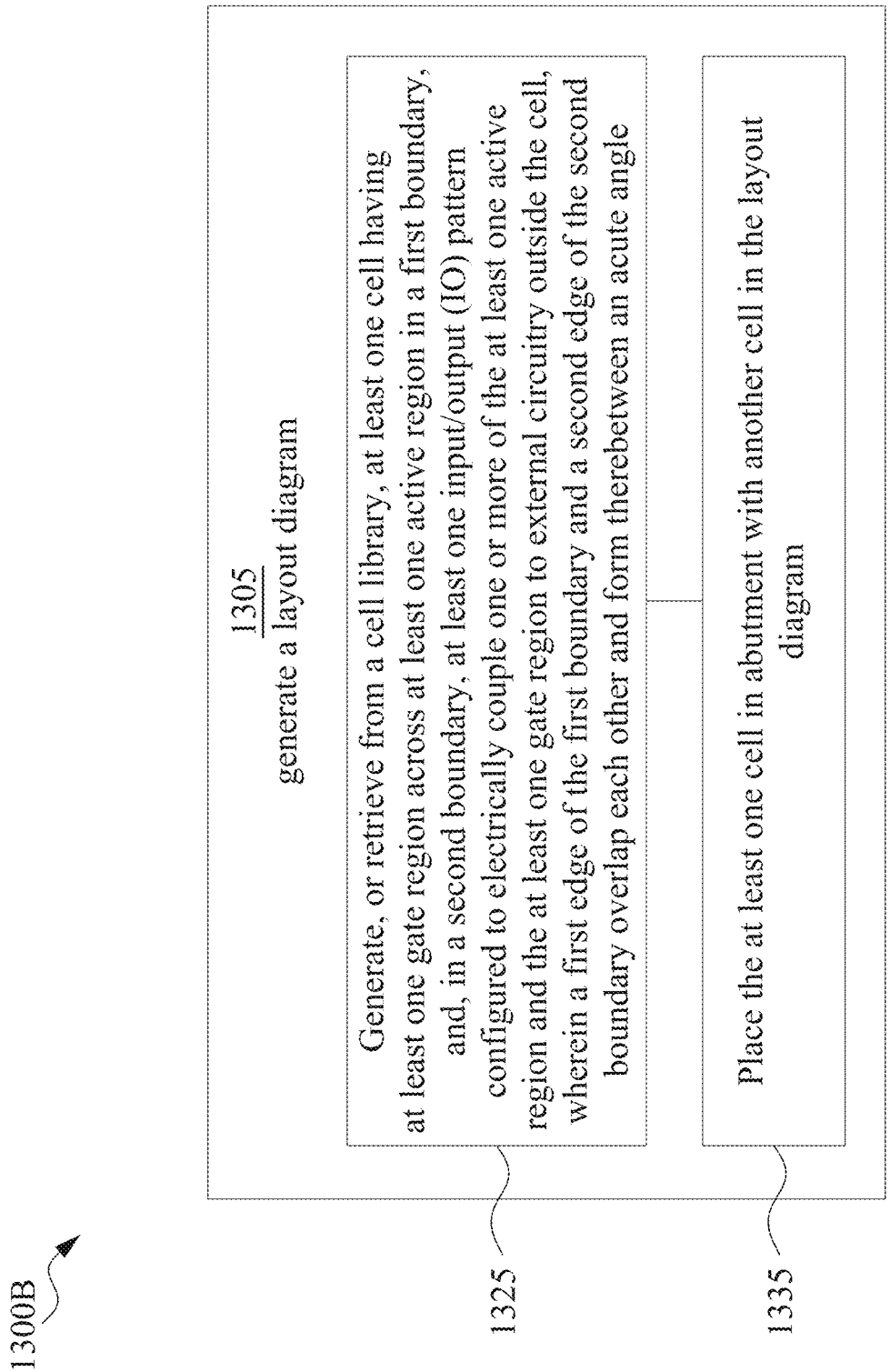

FIG. 13B is a flowchart of a method 1300B of generating a layout diagram, in accordance with some embodiments. More particularly, the flowchart of FIG. 13B shows additional blocks that demonstrates one example of procedures implementable in block 1305 of FIG. 13A, in accordance with one or more embodiments. In FIG. 13B, block 1305 includes blocks 1325, 1335.

At block 1325, at least one cell is generated, or retrieved from a cell library. The at least one generated or retrieved cell has at least one gate region across at least one active region in a first boundary, and, in a second boundary, at least one input/output (IO) pattern configured to electrically couple one or more of the at least one active region and the at least one gate region to external circuitry outside the first cell. A first edge of the first boundary and a second edge of the second boundary overlap each other and form therebetween an acute angle. For example, at least one cell corresponding to one or more of the cells 200, 500A-500C, 600A-600C, 800A-800B is generated, or retrieved from a cell library. The generated or retrieved cell, in the example configuration in FIG. 2C, has at least one gate region 210 across at least one active region 201, 202 in a first boundary 220. In a second boundary 250, the cell has at least one input/output (IO) pattern 245, 246 configured to electrically couple one or more of the at least one active region 210 and the at least one gate region 201, 202 to external circuitry outside the cell. A first edge 222 of the first boundary 220 and a second edge 253 of the second boundary 250 overlap each other and form therebetween an acute angle 257.

In some embodiments, the at least one generated or retrieved cell has at least one gate region across at least one active region, a conductive pattern overlapping and configured to be electrically coupled to the at least one active region or the at least one gate region, and an IO pattern overlapping and configured to be electrically coupled to the conductive pattern. The IO pattern and the at least one gate region form an acute angle therebetween. For example, at least one cell corresponding to one or more of the cells 200, 500A-500C, 600A-600C, 800A-800B is generated, or retrieved from a cell library. The generated or retrieved cell, in the example configuration in FIG. 2D, has at least one gate region 210 across at least one active region 201, 202, an M0 conductive pattern 241, 242 overlapping and configured to be electrically coupled to the at least one active region 210 or the at least one gate region 201, 202, and an IO pattern 245, 246 overlapping and configured to be electrically coupled to the M0 conductive pattern 241, 242. The IO pattern 245, 246 and the at least one gate region 210 form an acute angle 257 therebetween.

At block 1335, the at least one generated or retrieved cell is placed in abutment with another cell in the layout diagram. In some embodiments, the abutment is at a corner of corresponding boundaries of the cells as described with respect to FIGS. 10A-10B, or at a common edge of the corresponding boundaries of the cells as described with respect to FIG. 10C, or in a mixed approach as described with respect to FIGS. 10D-10E. In some embodiments, the other cell is a non-filler cell or a filler cell as described with respect to FIGS. 11A-11I and 12. In at least one embodiment, the generated layout diagram of the IC device is stored on a non-transitory computer-readable medium.

FIG. 13C is a flowchart of a method 1300C of fabricating one or more components of an IC device, based on the layout diagram, in accordance with some embodiments. More particularly, the flowchart of FIG. 13C shows additional blocks that demonstrates one example of procedures implementable in block 1315 of FIG. 13A, in accordance with one or more embodiments. In FIG. 13C, block 1315 includes blocks 1345, 1355, 1365.

At block 1345, at least one gate region across at least one active region over a substrate. An example manufacturing process starts from a substrate, such as the substrate 360 described with respect to FIG. 3. The substrate comprises, in at least one embodiment, silicon, silicon germanium (SiGe), gallium arsenic, or other suitable semiconductor or dielectric materials. Active regions are formed in or over the substrate, using one or more masks corresponding to one or more active regions in the layout diagrams described herein. A gate dielectric material layer is deposited over the substrate. Example materials of the gate dielectric material layer include, but are not limited to, a high-k dielectric layer, an interfacial layer, and/or combinations thereof. In some embodiments, the gate dielectric material layer is deposited over the substrate by atomic layer deposition (ALD) or other suitable techniques. A gate electrode layer is deposited over the gate dielectric material layer. Example materials of the gate electrode layer include, but are not limited to, polysilicon, metal, Al, AlTi, Ti, TiN, TaN, Ta, TaC, TaSiN, W, WN, MoN, and/or other suitable conductive materials. In some embodiments, the gate electrode layer is deposited by chemical vapor deposition (CVD), physical vapor deposition (PVD or sputtering), plating, atomic layer deposition (ALD), and/or other suitable processes. A patterning process is then performed, using one or more masks corresponding to one or more gate electrodes in the layout diagrams described herein. As a result, the gate dielectric material layer is patterned in to one or more gate dielectric layers, such as the gate dielectric layers 363, 364, and the gate electrode layer is patterned into one or more gate electrodes, such as the gate electrode 310 or the dummy gate regions 318, 319 described with respect to FIG. 3. In at least one embodiment, spacers are formed, by deposition and patterning, on opposite sides of each gate electrode. Example materials of the spacers include, but are not limited to, silicon nitride, oxynitride, silicon carbide and other suitable materials. Example deposition processes include, but are not limited to, plasma enhanced chemical vapor deposition (PECVD), low-pressure chemical vapor deposition (LPCVD), sub-atmospheric chemical vapor deposition (SACVD), atomic layer deposition (ALD), or the like. Example patterning processes include, but are not limited to, a wet etch process, a dry etch process, or combinations thereof. Drain/source regions, such as the drain/source regions 304, 306 described with respect to FIG. 3, are formed in the active regions of the substrate. In at least one embodiment, the drain/source regions are formed by using the gate electrodes and the spacers as a mask. For example, the formation of the drain/source regions is performed by an ion implantation or a diffusion process. Depending on the type of the devices or transistors, the drain/source regions are doped with p-type dopants, such as boron or BF2, n-type dopants, such as phosphorus or arsenic, and/or combinations thereof. A conductive layer, e.g., a metal, is deposited over the substrate, thereby making electrical connections to the drain/source regions. A planarizing process is performed to planarize the conductive layer, resulting in contact structures, such as the contact structures 336, 337 described with respect to FIG. 3, in electrical contact with the underlying drain/source regions. The planarizing process comprises, for example, a chemical mechanical polish (CMP) process. A dielectric layer is deposited over the substrate with the drain/source contacts formed thereon. The dielectric layer is etched, and the etched portions are filled with a conductive material, such as a metal, to form one or more VD and VG vias, such as the VG via 338 described with respect to FIG. 3. A planarizing process is performed to obtain a planarized structure.

At block 1355, deposition and patterning are performed to form, in a metal layer over the at least one gate region, a conductive pattern overlapping and electrically coupled to the at least one active region or the at least one gate region. In an example, an M0 layer including a conductive material, such as a metal, is deposited over the planarized structure and patterned to form various M0 conductive patterns, such as the M0 conductive pattern 342 described with respect to FIG. 3. In some embodiments, deposition and etching are performed to form at least one V0 via over and in electrical contact with the at least one M0 conductive patterns. In an example process, a dielectric layer is deposited over the patterned M0 layer. The dielectric layer is etched, and the etched portions are filled with a conductive material, such as a metal, to form one or more vias in a V0 layer. For example, the V0 layer comprises the V0 via 344 described with respect to FIG. 3. A planarizing process is then performed.

At block 1365, deposition and patterning are performed to form, in a pin access layer over the metal layer, an input/output (IO) pattern overlapping and electrically coupled to the conductive pattern. The IO pattern and the at least one gate region form an acute angle therebetween. For example, the pin access layer, e.g., the M1 layer, is deposited and patterned to form at least one M1 conductive pattern which extends obliquely to the gate regions, for example, as described with respect to FIGS. 2C-2D, 5A-5C, 6A-6C, 8A-8B. In an example process, an M1 layer including a conductive material, such as a metal, is deposited over the planarized structure obtained at the end of the formation of the V0 layer. The M1 layer is patterned to form at least one M1 conductive pattern, such as the M1 conductive pattern 346 described with respect to FIG. 3. The M1 conductive pattern 346 is an IO pattern that is electrically coupled to the corresponding M0 conductive pattern 342 through the corresponding V0 via 344, as described with respect to FIG. 3.

In some embodiments, the process further comprises etching and depositing at least one through via structure and depositing and patterning a BM0 layer. In some embodiments, as described with respect to FIG. 3, at least one through via is etched from a back side 362 of the substrate 360 toward a front side 361 of the substrate 360 which has transistors, e.g., 3NM, thereon. A conductive material, e.g., a metal, is deposited in the etched via to form the VB through via 332. The VB through via 332 is in electrical contact with a source/drain region 304 of at least one transistor, e.g., 3NM. A BM0 layer is deposited on the back side 362 of the substrate 360, and is patterned to form a BM0 conductive pattern 334 in electrical contact with the VB through via 332. In at least one embodiment, the BM0 conductive pattern 334 is configured as a power rail.

The described methods include example operations, but they are not necessarily required to be performed in the order shown. Operations may be added, replaced, changed order, and/or eliminated as appropriate, in accordance with the spirit and scope of embodiments of the disclosure. Embodiments that combine different features and/or different embodiments are within the scope of the disclosure and will be apparent to those of ordinary skill in the art after reviewing this disclosure.

In some embodiments, some or all of the methods discussed above are performed by an IC layout diagram generation system. In some embodiments, an IC layout diagram generation system is usable as part of a design house of an IC manufacturing system discussed below.

Figure 14:
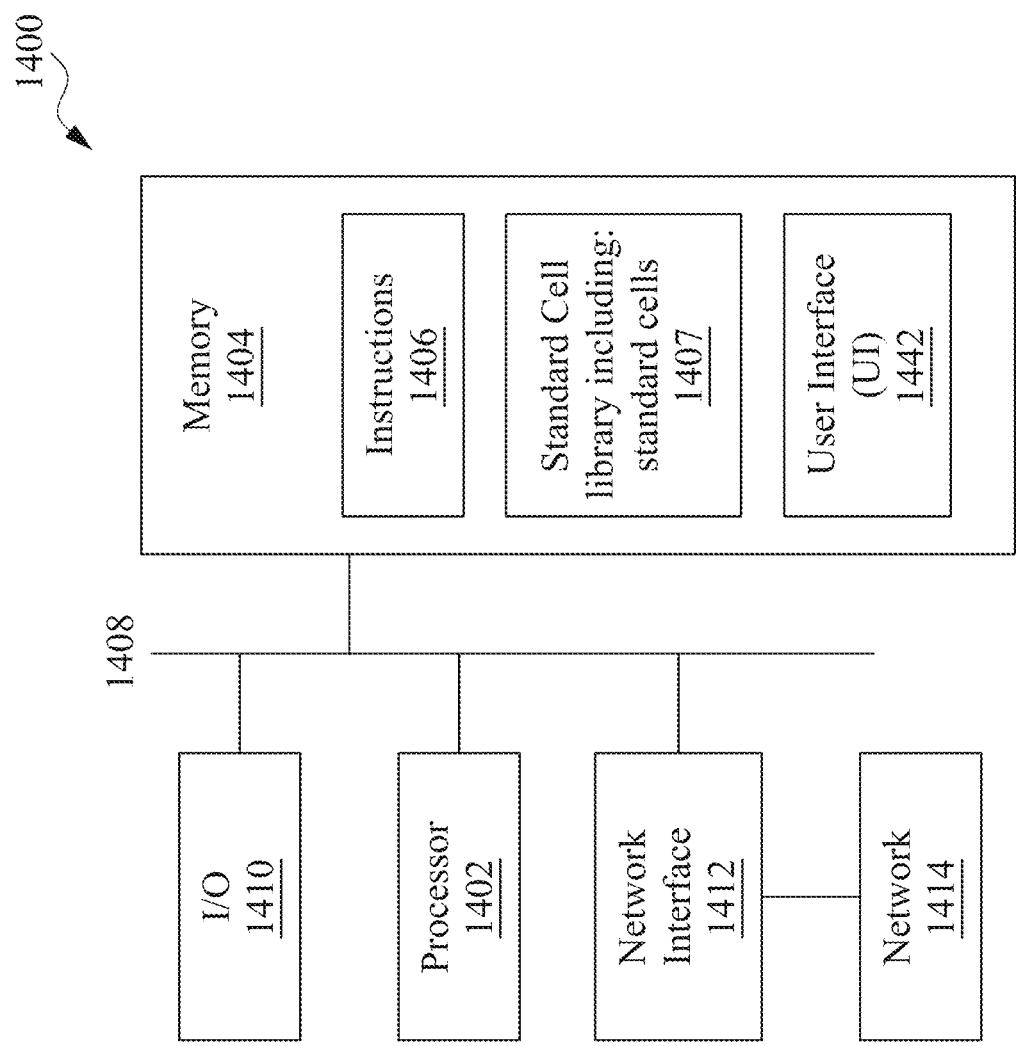
FIG. 14 is a block diagram of an electronic design automation (EDA) system in accordance with some embodiments.

FIG. 14 is a block diagram of an electronic design automation (EDA) system 1400 in accordance with some embodiments.

In some embodiments, EDA system 1400 includes an APR system. Methods described herein of designing layout diagrams represent wire routing arrangements, in accordance with one or more embodiments, are implementable, for example, using EDA system 1400, in accordance with some embodiments.

In some embodiments, EDA system 1400 is a general purpose computing device including a hardware processor 1402 and a non-transitory, computer-readable storage medium 1404. Storage medium 1404, amongst other things, is encoded with, i.e., stores, computer program code 1406, i.e., a set of executable instructions. Execution of instructions 1406 by hardware processor 1402 represents (at least in part) an EDA tool which implements a portion or all of the methods described herein in accordance with one or more embodiments (hereinafter, the noted processes and/or methods).

Processor 1402 is electrically coupled to computer-readable storage medium 1404 via a bus 1408. Processor 1402 is also electrically coupled to an I/O interface 1410 by bus 1408. A network interface 1412 is also electrically connected to processor 1402 via bus 1408. Network interface 1412 is connected to a network 1414, so that processor 1402 and computer-readable storage medium 1404 are capable of connecting to external elements via network 1414. Processor 1402 is configured to execute computer program code 1406 encoded in computer-readable storage medium 1404 in order to cause system 1400 to be usable for performing a portion or all of the noted processes and/or methods. In one or more embodiments, processor 1402 is a central processing unit (CPU), a multi-processor, a distributed processing system, an application specific integrated circuit (ASIC), and/or a suitable processing unit.

In one or more embodiments, computer-readable storage medium 1404 is an electronic, magnetic, optical, electromagnetic, infrared, and/or a semiconductor system (or apparatus or device). For example, computer-readable storage medium 1404 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1404 includes a compact disk-read only memory (CD-ROM), a compact disk-read/write (CD-R/W), and/or a digital video disc (DVD).

In one or more embodiments, storage medium 1404 stores computer program code 1406 configured to cause system 1400 (where such execution represents (at least in part) the EDA tool) to be usable for performing a portion or all of the noted processes and/or methods. In one or more embodiments, storage medium 1404 also stores information which facilitates performing a portion or all of the noted processes and/or methods. In one or more embodiments, storage medium 1404 stores library 1407 of standard cells including such standard cells as disclosed herein.

EDA system 1400 includes I/O interface 1410. I/O interface 1410 is coupled to external circuitry. In one or more embodiments, I/O interface 1410 includes a keyboard, keypad, mouse, trackball, trackpad, touchscreen, and/or cursor direction keys for communicating information and commands to processor 1402.

EDA system 1400 also includes network interface 1412 coupled to processor 1402. Network interface 1412 allows system 1400 to communicate with network 1414, to which one or more other computer systems are connected. Network interface 1412 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1400.

System 1400 is configured to receive information through I/O interface 1410. The information received through I/O interface 1410 includes one or more of instructions, data, design rules, libraries of standard cells, and/or other parameters for processing by processor 1402. The information is transferred to processor 1402 via bus 1408. EDA system 1400 is configured to receive information related to a UI through I/O interface 1410. The information is stored in computer-readable medium 1404 as user interface (UI) 1442.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1400. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 15:
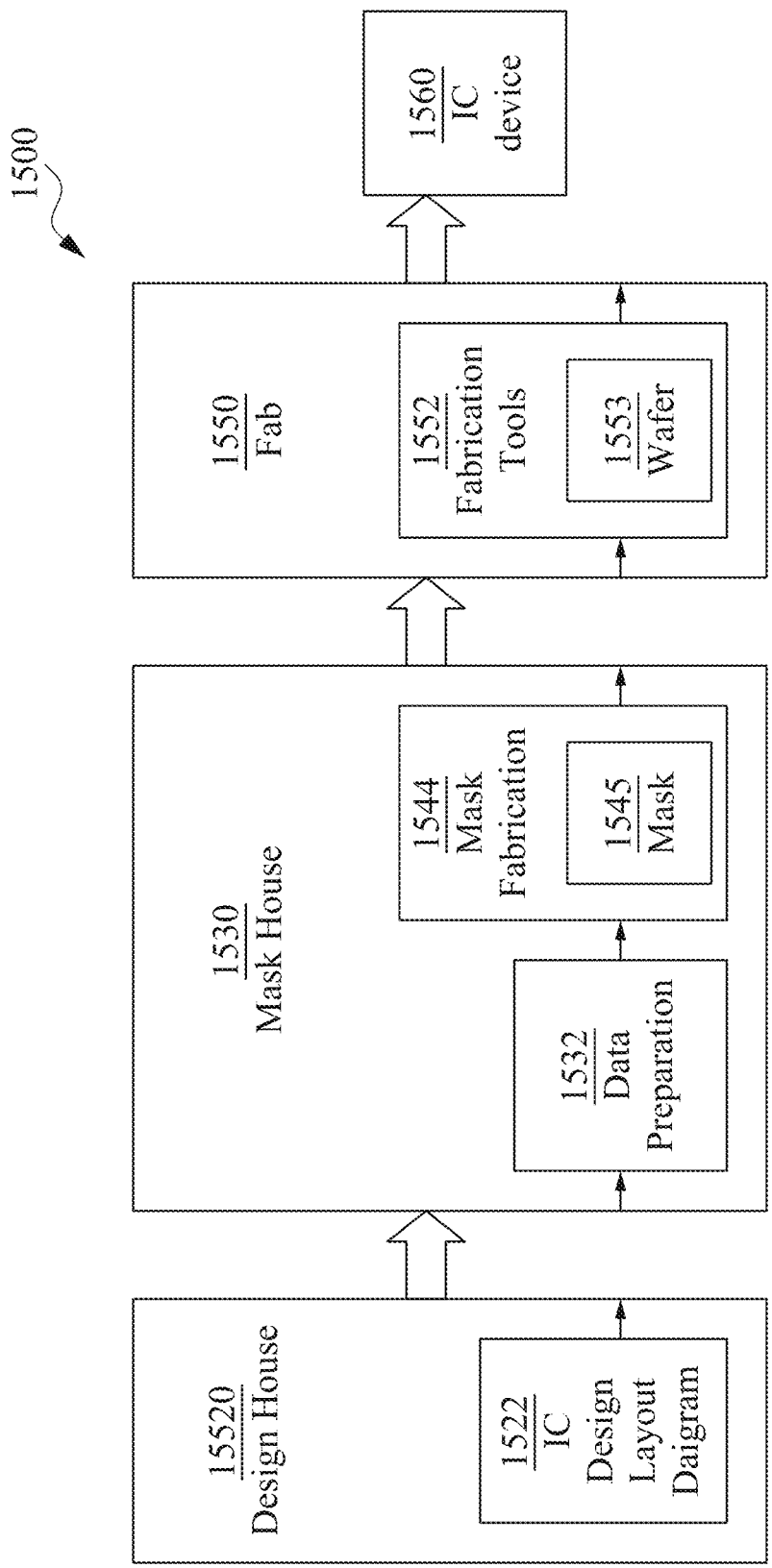
FIG. 15 is a block diagram of an IC device manufacturing system, and an IC manufacturing flow associated therewith, in accordance with some embodiments.

FIG. 15 is a block diagram of an integrated circuit (IC) manufacturing system 1500, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 1500.

In FIG. 15, IC manufacturing system 1500 includes entities, such as a design house 1520, a mask house 1530, and an IC manufacturer/fabricator ("fab") 1550, that interact with one another in the design, development, and manufacturing cycles and/or services related to manufacturing an IC device 1560. The entities in system 1500 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 1520, mask house 1530, and IC fab 1550 is owned by a single larger company. In some embodiments, two or more of design house 1520, mask house 1530, and IC fab 1550 coexist in a common facility and use common resources.

Design house (or design team) 1520 generates an IC design layout diagram 1522. IC design layout diagram 1522 includes various geometrical patterns designed for an IC device 1560. The geometrical patterns correspond to patterns of metal, oxide, or semiconductor layers that make up the various components of IC device 1560 to be fabricated. The various layers combine to form various IC features. For example, a portion of IC design layout diagram 1522 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1520 implements a proper design procedure to form IC design layout diagram 1522. The design procedure includes one or more of logic design, physical design or place-and-route operation. IC design layout diagram 1522 is presented in one or more data files having information of the geometrical patterns. For example, IC design layout diagram 1522 can be expressed in a GDSII file format or DFII file format.

Mask house 1530 includes data preparation 1532 and mask fabrication 1544. Mask house 1530 uses IC design layout diagram 1522 to manufacture one or more masks 1545 to be used for fabricating the various layers of IC device 1560 according to IC design layout diagram 1522. Mask house 1530 performs mask data preparation 1532, where IC design layout diagram 1522 is translated into a representative data file ("RDF"). Mask data preparation 1532 provides the RDF to mask fabrication 1544. Mask fabrication 1544 includes a mask writer. A mask writer converts the RDF to an image on a substrate, such as a mask (reticle) 1545 or a semiconductor wafer 1553. The design layout diagram 1522 is manipulated by mask data preparation 1532 to comply with particular characteristics of the mask writer and/or requirements of IC fab 1550. In FIG. 15, mask data preparation 1532 and mask fabrication 1544 are illustrated as separate elements. In some embodiments, mask data preparation 1532 and mask fabrication 1544 can be collectively referred to as mask data preparation.

In some embodiments, mask data preparation 1532 includes optical proximity correction (OPC) which uses lithography enhancement techniques to compensate for image errors, such as those that can arise from diffraction, interference, other process effects and the like. OPC adjusts IC design layout diagram 1522. In some embodiments, mask data preparation 1532 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 1532 includes a mask rule checker (MRC) that checks the IC design layout diagram 1522 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1522 to compensate for limitations during mask fabrication 1544, which may undo part of the modifications performed by OPC in order to meet mask creation rules.

In some embodiments, mask data preparation 1532 includes lithography process checking (LPC) that simulates processing that will be implemented by IC fab 1550 to fabricate IC device 1560. LPC simulates this processing based on IC design layout diagram 1522 to create a simulated manufactured device, such as IC device 1560. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 1522.

It should be understood that the above description of mask data preparation 1532 has been simplified for the purposes of clarity. In some embodiments, data preparation 1532 includes additional features such as a logic operation (LOP) to modify the IC design layout diagram 1522 according to manufacturing rules. Additionally, the processes applied to IC design layout diagram 1522 during data preparation 1532 may be executed in a variety of different orders.

After mask data preparation 1532 and during mask fabrication 1544, a mask 1545 or a group of masks 1545 are fabricated based on the modified IC design layout diagram 1522. In some embodiments, mask fabrication 1544 includes performing one or more lithographic exposures based on IC design layout diagram 1522. In some embodiments, an electron-beam (e-beam) or a mechanism of multiple e-beams is used to form a pattern on a mask (photomask or reticle) 1545 based on the modified IC design layout diagram 1522. Mask 1545 can be formed in various technologies. In some embodiments, mask 1545 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 1545 includes a transparent substrate (e.g., fused quartz) and an opaque material (e.g., chromium) coated in the opaque regions of the binary mask. In another example, mask 1545 is formed using a phase shift technology. In a phase shift mask (PSM) version of mask 1545, various features in the pattern formed on the phase shift mask are configured to have proper phase difference to enhance the resolution and imaging quality. In various examples, the phase shift mask can be attenuated PSM or alternating PSM. The mask(s) generated by mask fabrication 1544 is used in a variety of processes. For example, such a mask(s) is used in an ion implantation process to form various doped regions in semiconductor wafer 1553, in an etching process to form various etching regions in semiconductor wafer 1553, and/or in other suitable processes.

IC fab 1550 is an IC fabrication business that includes one or more manufacturing facilities for the fabrication of a variety of different IC products. In some embodiments, IC Fab 1550 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 1550 includes fabrication tools 1552 configured to execute various manufacturing operations on semiconductor wafer 1553 such that IC device 1560 is fabricated in accordance with the mask(s), e.g., mask 1545. In various embodiments, fabrication tools 1552 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 1550 uses mask(s) 1545 fabricated by mask house 1530 to fabricate IC device 1560. Thus, IC fab 1550 at least indirectly uses IC design layout diagram 1522 to fabricate IC device 1560. In some embodiments, semiconductor wafer 1553 is fabricated by IC fab 1550 using mask(s) 1545 to form IC device 1560. In some embodiments, the IC fabrication includes performing one or more lithographic exposures based at least indirectly on IC design layout diagram 1522. Semiconductor wafer 1553 includes a silicon substrate or other proper substrate having material layers formed thereon. Semiconductor wafer 1553 further includes one or more of various doped regions, dielectric features, multi-level interconnects, and the like (formed at subsequent manufacturing steps).

Details regarding an integrated circuit (IC) manufacturing system (e.g., system 1500 of FIG. 15), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, an integrated circuit (IC) device comprises a substrate, and a cell over the substrate. The cell comprises at least one active region and at least one gate region extending across the at least one active region. The cell further comprises at least one input/output (IO) pattern configured to electrically couple one or more of the at least one active region and the at least one gate region to external circuitry outside the cell. The at least one IO pattern extends obliquely to both the at least one active region and the at least one gate region.

In some embodiments, a method comprises generating a layout diagram of a cell of an integrated circuit (IC), and storing the generated layout diagram on a non-transitory computer-readable medium. In the generating the layout diagram of the cell, in a first boundary, at least one gate region is arranged across at least one active region, and, in a second boundary, at least one input/output (IO) pattern configured to electrically couple one or more of the at least one active region and the at least one gate region to external circuitry outside the first cell is arranged. A first edge of the first boundary and a second edge of the second boundary overlap each other and form therebetween an acute angle.

In some embodiments, a method comprises forming at least one gate region across at least one active region over a substrate. The method further comprises depositing and patterning, in a metal layer over the at least one gate region, a conductive pattern overlapping and electrically coupled to the at least one active region or the at least one gate region. The method further comprises depositing and patterning, in a pin access layer over the metal layer, an input/output (IO) pattern overlapping and electrically coupled to the conductive pattern. The IO pattern and the at least one gate region form an acute angle therebetween.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) device, comprising:
   a substrate;
   a cell over the substrate, the cell comprising:
      at least one active region;
      at least one gate region extending across the at least one active region; and
      at least one input/output (IO) pattern configured to electrically couple one or more of the at least one active region and the at least one gate region to external circuitry outside the cell;
   a metal-zero (M0) layer over the at least one gate region; and
   an upper metal layer over the M0 layer,
   wherein
   the at least one IO pattern extends obliquely to both the at least one active region and the at least one gate region,
   the M0 layer comprises at least one M0 conductive pattern electrically coupled to the at least one active region or the at least one gate region, and
   the upper metal layer comprises the at least one IO pattern electrically coupled to the at least one M0 conductive pattern.

2. The IC device of claim 1, wherein
   the at least one active region is elongated along a first axis, and
   the at least one gate region is elongated along a second axis transverse to the first axis.

3. The IC device of claim 1, wherein
   the upper metal layer is a metal-one (M1) layer.

4. The IC device of claim 1, wherein
   the at least one active region comprises first and second active regions,
   the first and second active regions extend along a first axis, and are directly adjacent each other along a second axis transverse to the first axis, and
   the M0 layer has no more than three rows of M0 conductive patterns over and between the first and second active regions, the rows of M0 conductive patterns extending along the first axis and directly adjacent each other along the second axis.

5. The IC device of claim 1, wherein
the at least one active region comprises first and second active regions,
the first and second active regions extend along a first axis, and are directly adjacent each other along a second axis transverse to the first axis, and
the M0 layer has
a first row of one or more M0 conductive patterns over the first active region, the first row extending along the first axis, and
a second row of one or more M0 conductive patterns over the second active region, the second row extending along the first axis and directly adjacent the first row along the second axis.

6. The IC device of claim 1, wherein
the at least one active region comprises first, second and third active regions, the second active region arranged between the first and third active regions,
the IC device further comprises:
first, second and third contact structures over and in electrical contact with corresponding source/drain regions correspondingly in the first, second and third active regions; and
an extended contact structure over and electrically coupled to the first and third contact structures, the extended contact structure extending over the second contact structure without being electrically coupled to the second contact structure, and
the M0 layer is over the first, second and third contact structures, and the extended contact structure.

7. The IC device of claim 1, wherein
the cell further comprises at least one dummy gate region, and
the at least one IO pattern extends obliquely to and overlaps the at least one dummy gate region.

8. A method, comprising:
generating a layout diagram of a first cell of an integrated circuit (IC) device, said generating the layout diagram of the first cell comprising:
arranging, in a first boundary, at least one gate region across at least one active region, and
arranging, in a second boundary, at least one input/output (IO) pattern configured to electrically couple one or more of the at least one active region and the at least one gate region to external circuitry outside the first cell,
wherein a first edge of the first boundary and a second edge of the second boundary overlap each other and form therebetween an acute angle; and
storing the generated layout diagram on a non-transitory computer-readable medium.

9. The method of claim 8, wherein
the at least one active region extends along a first axis,
the at least one gate region extends along a second axis transverse to the first axis,
the first edge of the first boundary extends along the second axis, and
the second edge of the second boundary extends along a third axis oblique to both the first axis and the second axis.

10. The method of claim 8, wherein
the first boundary is rectangular, and
the second boundary is hexagonal.

11. The method of claim 8, wherein
the at least one IO pattern is parallel to the second edge of the second boundary.

12. The method of claim 8, wherein
the second boundary is a convex hexagon.

13. The method of claim 8, wherein
the second boundary is a concave hexagon having one internal corner greater than 180 degrees, and five internal corner smaller than 180 degrees.

14. The method of claim 8, wherein
the second boundary is a concave hexagon having two internal corner greater than 180 degrees, and four internal corner smaller than 180 degrees.

15. The method of claim 8, further comprising:
generating an IC layout diagram, said generating the IC layout diagram comprising placing the first and second boundaries of the first cell in abutment with corresponding first and second boundaries of a second cell in the IC layout diagram.

16. The method of claim 15, wherein
in said placing, the second boundary of the first cell is placed in abutment with the corresponding second boundary of the second cell along a common edge, and
the common edge is oblique to the at least one gate region in the first cell.

17. The method of claim 15, wherein
the second boundary of the second cell has a shape of a rectangle, an isosceles trapezoid, a rhombus, a hexagon, or a combination of more than one hexagons.

18. A method, comprising:
forming at least one gate region across at least one active region over a substrate;
depositing and patterning, in a metal layer over the at least one gate region, a conductive pattern overlapping and electrically coupled to the at least one active region or the at least one gate region; and
depositing and patterning, in a pin access layer over the metal layer, an input/output (IO) pattern overlapping and electrically coupled to the conductive pattern, wherein the IO pattern and the at least one gate region form an acute angle therebetween.

19. The method of claim 18, further comprising:
forming the at least one active region including first, second and third active regions, the second active region arranged between the first and third active regions;
depositing and patterning first, second and third contact structures over and in electrical contact with corresponding source/drain regions correspondingly in the first, second and third active regions; and
depositing and patterning an extended contact structure over and electrically coupled to the first and third contact structures, the extended contact structure extending over the second contact structure without being electrically coupled to the second contact structure,
wherein the metal layer is over the first, second and third contact structures, and the extended contact structure.

20. The method of claim 18, further comprising:
forming at least one dummy gate region,
wherein the at least one IO pattern extends obliquely to and overlaps the at least one dummy gate region.

* * * * *